(12) United States Patent
Soda

(10) Patent No.: US 7,799,693 B2
(45) Date of Patent: Sep. 21, 2010

(54) METHOD FOR MANUFACTURING A SEMICONDUCTOR DEVICE

(75) Inventor: Eiichi Soda, Ibaraki (JP)

(73) Assignee: NEC Electronics Corporation, Kanagawa (JP)

( * ) Notice: Subject to any disclaimer, the term of this patent is extended or adjusted under 35 U.S.C. 154(b) by 434 days.

(21) Appl. No.: 11/183,806

(22) Filed: Jul. 19, 2005

(65) Prior Publication Data

US 2006/0019491 A1    Jan. 26, 2006

(30) Foreign Application Priority Data

Jul. 23, 2004    (JP)    ............... 2004-216152

(51) Int. Cl.
    *H01L 21/302*    (2006.01)
    *H01L 21/461*    (2006.01)
(52) U.S. Cl. ............... 438/709; 257/E21.256
(58) Field of Classification Search ........... 438/639, 438/687, 709; 257/E21.256
    See application file for complete search history.

(56) References Cited

U.S. PATENT DOCUMENTS

| 6,284,149 | B1 * | 9/2001 | Li et al. | ............. | 216/64 |
| 6,284,657 | B1 * | 9/2001 | Chooi et al. | ............. | 438/687 |
| 7,256,499 | B1 | 8/2007 | You et al. | | |
| 2002/0030297 | A1 * | 3/2002 | Gallagher et al. | ............. | 264/49 |

FOREIGN PATENT DOCUMENTS

| JP | 2000-294634 | | 10/2000 |
| JP | 2002-110644 | | 4/2002 |
| JP | 2003-023072 | | 1/2003 |
| JP | 2003-124200 | * | 4/2003 |
| JP | 2003-197742 | | 7/2003 |
| JP | 2004-140025 | | 5/2004 |
| JP | 2004-152997 | | 5/2004 |
| JP | 2004-281936 | | 10/2004 |
| JP | 2005-045176 | | 2/2005 |

OTHER PUBLICATIONS

Machine Translation of Foreign Patent Document 2003-124200 (Japan); Apr. 2003; Enomoto et al.; Translated: 11:58:13 JST Sep. 3, 2007.*
Quirk, M. and Serda, J.; Semiconductor Manufacturing Technology; 2001; Prentice-Hall, Inc.; p. 456-457; 622.*
The Usborne Illustrated Dictionary of Science; 2001; Usborne Publishing Ltd.; p. 189.*
Japanese Patent Office issued a Japanese Office Action dated Aug. 4, 2009, Application No. 2004-216152.
Kawahara et al., "A New Plasma-Enhanced Co-Polymerization (PCP) Technology for Reinforcing Mechanical Properties of Organic Silica Low-k/Cu Interconnects on 300 mm Wafers", IEEE, 2003, pp. 6.2.1-6.2.4.

* cited by examiner

*Primary Examiner*—Matthew C Landau
*Assistant Examiner*—Vicki B Booker
(74) *Attorney, Agent, or Firm*—Young & Thompson

(57) ABSTRACT

Method for manufacturing a semiconductor device including a semiconductor substrate, an element formed on the substrate, and an insulating film formed on the element, includes: (a) forming a first conductive layer (b) forming a first insulating film on the upper portion of the first conductive layer; (c) forming a second insulating film with a porous structure on the first insulating film; (d) forming a third insulating film different from the second insulating film on the second insulating film; (e) forming a via hole in the second and third insulating film by dry etching of the third insulating films; (f) removing a part of the first insulating film such that the surface of the first conductive layer is exposed at the bottom of the via hole and (g) forming a second conductive material film layer so as to fill the via hole.

25 Claims, 13 Drawing Sheets

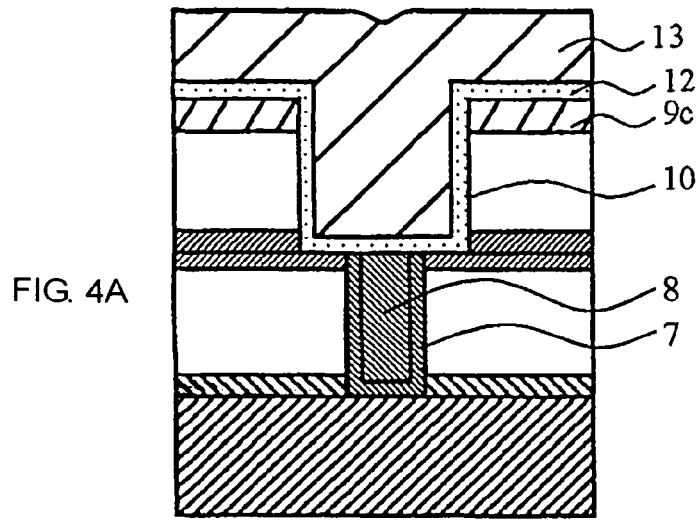
FIG. 4A
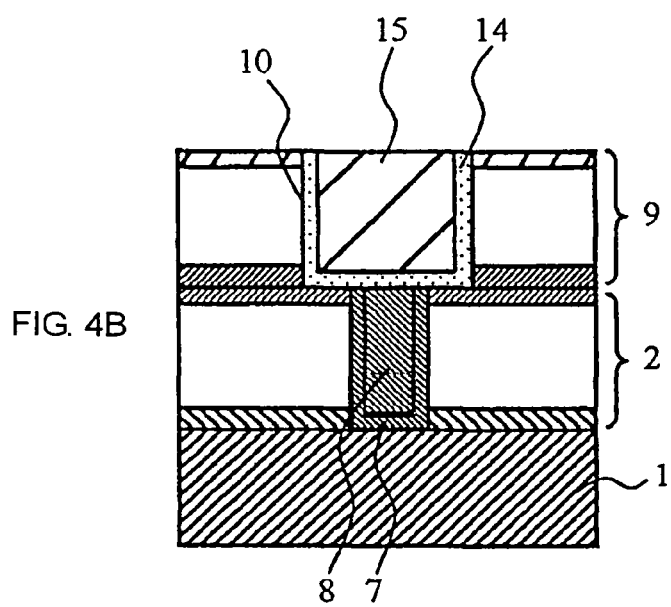
FIG. 4B
FIG. 5
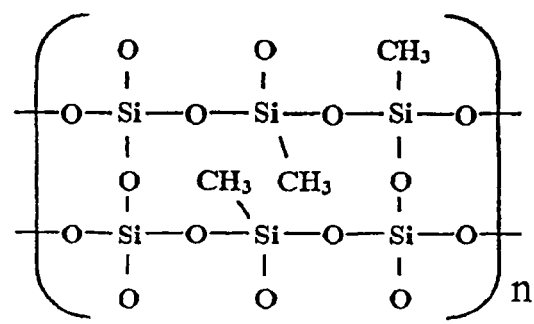

METHOD FOR MANUFACTURING A SEMICONDUCTOR DEVICE

This application is based on Japanese Patent application NO. 2004-216152, the content of which is incorporated hereinto by reference.

BACKGROUND OF THE INVENTION

1. Field of the Invention

The present invention relates to a method for manufacturing a semiconductor device, and, more particularly, to a method for manufacturing a semiconductor device including forming an interconnect by damascene process in a porous insulating film.

2. Related Art

Recently, with the remarkable high speed of operations of semiconductor devices, there has been a problem that transmission delay is caused by reduction in a signal propagation speed due to interconnect resistance in a multilayered interconnection structure and parasitic capacitance between interconnects. Such a problem has been tending to be more and more remarkable because the interconnect resistance increases, and the parasitic capacitance between interconnects increases as the width of the interconnect and the interconnect interval become finer along with higher levels of integration of the semiconductor devices. Then, in order to prevent the signal delay due to the interconnect resistance and the parasitic capacity between interconnects, a copper interconnect, instead of a conventional aluminum interconnect, has been introduced. At the same time, it has been tried to use a low dielectric constant insulating film, or a low-k film, for the interlayer insulating film. Here, the low dielectric constant film is an insulating film with a relative dielectric constant not larger than 3.9, which is the relative constant of a silicon dioxide ($SiO_2$).

One of the methods for forming the above-described copper interconnect includes a dual/single damascene process. Considering that control of an etching rate for copper is more difficult in comparison with that for aluminum, the copper interconnect is formed by the damascene process which is a technology by which interconnect is formed without etching process. The damascene process includes forming an interconnect trench or a via hole in an interlayer insulating film and filling the interconnect trench or the via hole with copper or copper alloy. A multilayered copper interconnect structure is formed as follows, for example. Firstly, a silicon carbide (SiC) film with a small relative dielectric constant as an insulated barrier layer (or an etching stopper layer) is formed on the lower copper interconnect. Then, an organic insulating film as a low-k film and an $SiO_2$ film as a cap film are deposited in this order on the silicon carbide film to form a laminated film. Thereafter, a via hole or interconnect trench of a dual damascene process is formed in the laminated film by dry etching thereof. Then, an interconnect material comprising a barrier metal, and copper or copper alloy material is formed in the via hole or the interconnect trench to form a via plug or copper interconnect in the upper layer. The interconnect material is formed by a sputtering method, an atomic layer deposition (ALD) method, a copper plate method, and the like in such a way that the interconnect material fills the via hole or the interconnect trench. Then, the interconnect material is selectively removed by a chemical mechanical polishing (CMP) method so that the interconnect material is left only in the via hole or the interconnect trench and the surface of the interconnect material is made flatter.

In development of a semiconductor device, finer component elements have been developed, for example, the design rule has changed to 45 nanometers from 65 nanometers. Moreover, recently, the relative dielectric constant of a low dielectric constant film used for the damascene interconnect is required to be about 2.0 or less. Thereby, a porous low dielectric constant film has been indispensable as a low-k film.

However, when the via plug or the copper interconnect, formed by the damascene process, is put into practical use, with the low-k film used as the interlayer insulating film, the following problems are generated.

Firstly, the surface of the lower copper interconnect which is exposed when the via hole or the interconnect trench is formed in the upper laminated film by dry etching, is easily oxidized. Thus, an insulating reactant adheres to the surface. At the same time, the side wall of the via hole or the interconnect trench, formed in the above-described laminated film easily undergoes side-etching to cause the manufacturing yield of the semiconductor device having the above-described copper interconnect lowered. Here, the adhesion of the above-described insulating reactant causes poor electric connection of the copper interconnect between the lower or the upper interconnect. Moreover, the side etching of the above-described side wall causes bad filling of the interconnect material in the via hole or the interconnect trench.

Therefore, the etching gas used for dry etching of the above-described laminated film, especially, the SiC film of the insulating barrier layer has been variously examined, and it has been proposed that a nitrogen content gas, instead of an oxygen content gas, is added to the etching gas (for example, Japanese Laid-open patent publication No. 2003-124200 and Japanese Laid-open patent publication No. 2002-110644).

Secondly, especially when a porous film with a low dielectric constant is used for the low-k film, a lot of holes (pores) are exposed on the side wall of the above-described via hole or the interconnect trench during the manufacturing process. Then, moisture, copper of the interconnect material, or the barrier metal such as tantalum (Ta), or tantalum nitride (TaN) intrude into the inside of the low-k film through the holes or pores to cause reduction in the reliability of the interlayer insulating film, rise in the relative dielectric constant, increase in the leakage current between the interconnects, and the like.

Therefore, it has been proposed (for example, Japanese Laid-open patent publication No, 2003-197742 and Japanese Laid-open patent publication No. 2000-294634) that an inorganic insulating film (pore seal) with a close-grained film quality is provided on the side wall of the above-described via hole or the interconnect trench as a side-wall protection film.

However, the above-described conventional side wall protection film includes an insulating film such as an $SiO_2$ film with a relative dielectric constant of about four, or a metallic oxide layer with a larger relative dielectric constant than that of the $SiO_2$ film to have an extremely higher relative dielectric constant than that of the low dielectric constant film with a relative dielectric constant of about 2.5 or less. Accordingly, when the above-described conventional side-wall protection film is applied to formation of the copper interconnect by the damascene process, the relative dielectric constant of the whole interlayer insulating film increases, and it becomes difficult to reduce the parasitic capacity between the copper interconnects.

SUMMARY OF THE INVENTION

The inventor of the present invention has studied the damage to the side wall of the via hole or the interconnect trench while selectively removing the etching stopper layer, an insulating barrier layer, formed on the lower interconnect by etching when the damascene interconnect structure is formed with a porous insulating layer used as an interlayer insulating film. Firstly, the inventor thought that the adhesion of the insulating reactant to the surface of the lower interconnect can be prevented by using a mixed gas of fluorine compound gas and a nitrogen content gas as an etching gas while selectively removing the etching stopper layer, an insulating barrier layer, formed on the lower interconnect by etching and used the mixed gas as the etching gas. Then, the inventor found that even when the mixed gas is used unless the etching condition is appropriately controlled, the damage layer is formed on the side wall of the via hole or the interconnect trench, and moisture, copper of the interconnect material, or the barrier metal such as tantalum (Ta), or tantalum nitride (TaN) intrude into the inside of the low-k film through the holes or pores to cause reduction in the reliability of the interlayer insulating film, rise in the relative dielectric constant, increase in the leakage current between the interconnects, and the like. It is thought that the side wall is reformed by radical elements of fluorine which are generated by the plasma excitation at the dry etching.

Therefore, the inventor further studied the intrusion of the fluorine into the porous insulating layer. As a result, the inventor has found that the fluorine intrusion can be remarkably reduced or controlled during plasma excitation of an etching gas in the above-described dry etching by decreasing fluorine radical elements, and, at the same time, generating a number of nitrogen ions or fluorine ions, both of which mainly go straight in a more rectilinear manner. The present invention has been made based on the above new findings.

According to the present invention, there is provided a method for manufacturing a semiconductor device including a semiconductor substrate, an element formed on the semiconductor substrate, and an insulating film formed on the element, comprising:

(a) forming a first conductive layer composed of copper as a main component on the insulating film;

(b) forming a first insulating film composed of silicon carbide as a main component on the upper portion of the first conductive layer;

(c) forming a second insulating film with a porous structure on the first insulating film;

(d) forming a third insulating film different from the second insulating film on the second insulating film;

(e) forming a via hole or an interconnect trench in the second insulating film and the third insulating film by dry etching of the third insulating film and the second insulating film in this order;

(f) removing a part of the first insulating film by dry etching with the third insulating film used as an etching mask, and a mixed gas of fluorine compound gas and a nitrogen content gas used as an etching gas under the condition where the pressure of the mixed gas in an etching processing chamber is set within a range of 0.1 Pa to 6.0 Pa, such that the surface of the first conductive layer is exposed at the bottom of the via hole or the interconnect trench, the fluorine compound gas including at least one of the gases selected from a group including $CF_4$, $CHF_3$, $CH_2F_2$, $CH_3F$, and $NF_3$; and (g) forming a second conductive material film layer so as to fill the via hole or the interconnect trench.

According to the present invention, there is provided a method for manufacturing a semiconductor device including a semiconductor substrate, an element formed on the semiconductor substrate, and an insulating film formed on the element, comprising:

(a) forming a first conductive layer composed of copper as a main component on the insulating film;

(b) forming a first insulating film composed of silicon carbide as a main component on the upper portion of the first conductive layer;

(c) forming a second insulating film with a porous structure on the first insulating film;

(d) forming a third insulating film different from the second insulating film on the second insulating film;

(e) forming a via hole or an interconnect trench in the second insulating film and the third insulating film by dry etching of the third insulating film and the second insulating film in this order;

(f) removing a part of the first insulating film by dry etching under plasma-excitation of a mixed gas of fluorine compound gas and a nitrogen content gas with the third insulating film used as an etching mask, while forming a side wall protective layer on the side wall of the via hole or the interconnect trench by adhering scatters or reaction products, generated by sputtering of the first insulating film with ions generated by the plasma excitation, onto the side wall of the via hole or the interconnect trench, such that the surface of the first conductive layer is exposed at the bottom of the via hole or the interconnect trench, the fluorine compound gas including at least one of the gases selected from a group including $CF_4$, $CHF_3$, $CH_2F_2$, $CH_3F$, and $NF_3$; and (g) forming a second conductive material film layer so as to fill the via hole or the interconnect trench.

In the method of the present invention, the third insulating film may be formed with a material containing carbon.

As described above, by appropriately adjusting the condition such as the mixed gas, the etching condition, the materials composing the semiconductor device, generation of the damage layer on the side wall of the trench or the via hole and generation of voids in the porous low-k film can be reduced in process of removing a part of the first insulating layer to expose the surface of the conductive layer in the via hole or the interconnect trench.

According to a configuration of the present invention, a porous low dielectric constant film can be applied as an interlayer insulating film between interconnect at practical levels. Thereby, a semiconductor device with high reliability and high-speed operations is realized.

BRIEF DESCRIPTION OF THE DRAWINGS

The above and other objects, advantages and features of the present invention will be more apparent from the following description taken in conjunction with the accompanying drawings, in which:

FIG. 4A is a sectional element view showing a process following the process shown in FIG. 3C;

FIG. 4B is a sectional element view showing a process following the process shown in FIG. 4A;

FIG. 5 is a structural view showing a composition of an MSQ film of a low dielectric constant film;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, some of embodiments according to the invention will be explained in detail, referring to drawings.

Firstly, an embodiment in which the inventers first tried will be explained.

Hereinafter, a process in which a via-plug is formed according to a damascene process using a low-k film including a porous insulating film as an interlayer insulating film will be explained in detail, referring to FIGS. 12 to 14. Here, FIGS. 12 to 14 are sectional element views showing processes according to which an insulating barrier layer on a lower interconnect is formed with an SiC film, a low-k film is formed with a porous low dielectric constant film, and by the damascene process a via hole and a via plug are formed between interconnect layers.

Figure 12A:
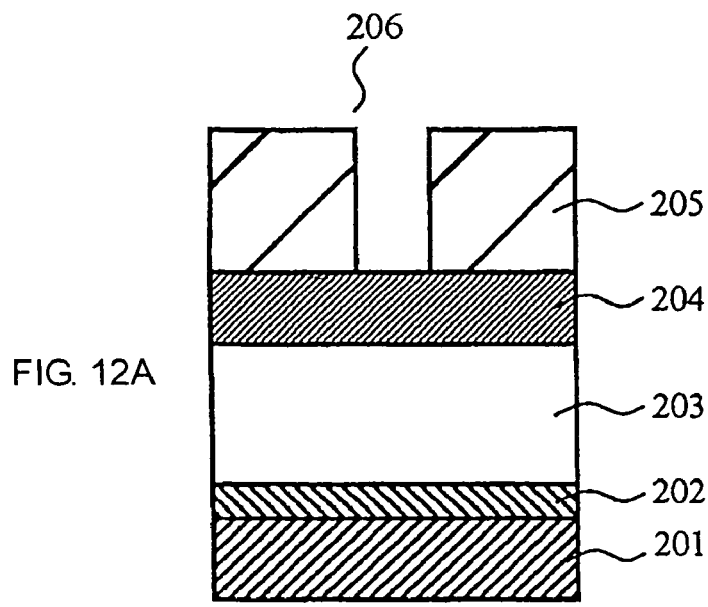
FIG. 12A is a sectional element view showing a process according to which dual damascene interconnect structure is manufactured.

Firstly, a first etching stopper layer 202 including an SiC film is deposited on a lower interconnect 201 of copper interconnect as shown in FIG. 12A. Then, a low-k film 203 is deposited on the first etching stopper layer 202. Here, the low-k film 203 may be a porous methyl silsesquioxane (p-MSQ) film with a relative dielectric constant of, for example, 2.5 or less.

Subsequently, a cap layer 204 is deposited on the above-described low-k film 203. The cap layer 204 is formed to improve the $O_2$ plasma-ashing tolerance of the resist film at reworking for forming a resist mask, to prevent a rise in the dielectric constant of the low-k film 203 by moisture absorption, and, furthermore, to function as a polishing stopper at CMP after copper plating. This cap layer 204 may be formed with, for example, a silicon oxide film. Subsequently, an ARC film (not shown) of an antireflection film and a resist mask 205 are formed on the cap layer 204 by a well-known photolithographic technique. Then, a via hole pattern 206 is formed on the resist mask 205.

Figure 12B:
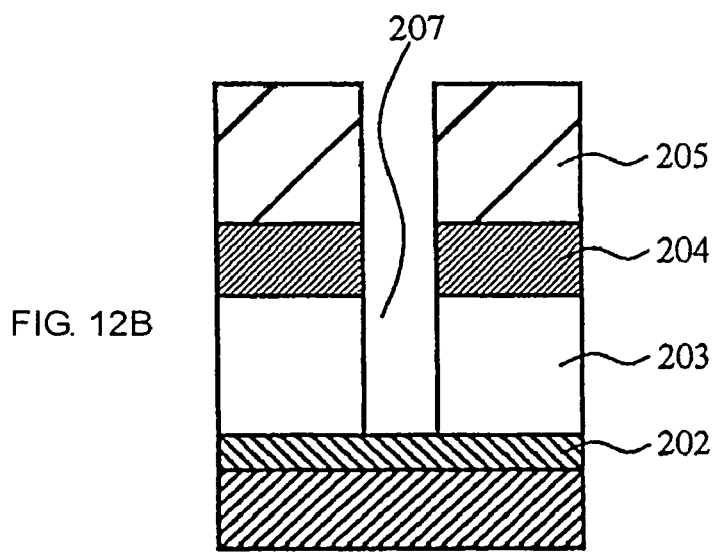
FIG. 12B is a sectional element view showing a process following the process shown in FIG. 12A.

Subsequently, as shown in FIG. 12B, the cap layer 204 and the low-k film 203 are selectively removed by dry etching in this order in a reactiveness ion etching (RIE) device to form a via hole 207. At this dry etching, a mixed gas system of fluorocarbon/Ar/$N_2$ is used as an etching gas. Less film damage is caused on a low-k film 203 by using this gas system. Here, the etching device has parallel-plate electrodes of an upper electrode/a lower electrode, which are facing each other in a chamber, and a high-frequency power source is connected to the upper electrode, or the lower electrode on which a substrate (semiconductor wafer) to be processed is mounted. Then, the above-described etching gas is introduced into the chamber, and plasma excitation of the gas is executed by the above-described high-frequency power source. The above-described fluorocarbon gas is, for example, a gas of $CF_4$, $C_4F_8$, or $C_5F_8$, and the gas pressure during dry etching is set at 10 Pa to 40 Pa of a usual etching pressure.

Figure 12C:
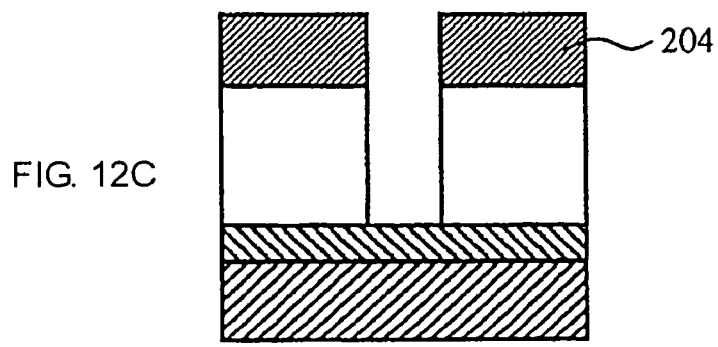
FIG. 12C is a sectional element view showing a process following the process shown in FIG. 12B.

After forming the via hole 207 on the interlayer insulating film including the low-k film 203 as mentioned above, the resist mask 205 is removed without damaging the cap layer 204, using high-temperature $H_2$/He plasma, low-temperature $N_2$/$H_2$ plasma, and the like to expose the cap layer 204, as shown in FIG. 12C.

Figure 13A:
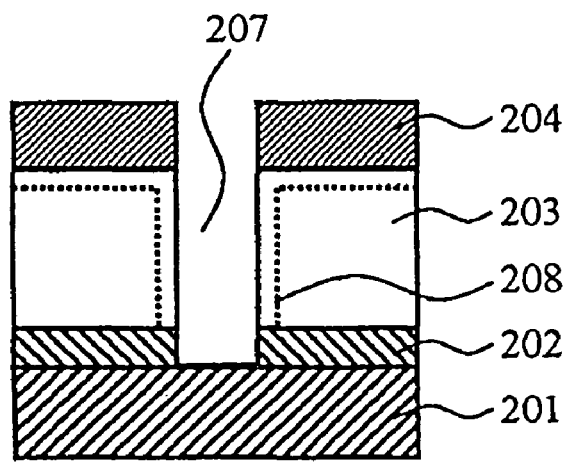
FIG. 13A is a sectional element view showing a process following the process shown in FIG. 12C.

Subsequently, in dry etching using the cap layer 204 as a hard mask, dry etching of the first etching stopper layer 202 is executed, using a mixed gas of $CHF_3$/Ar/$N_2$, a mixed gas of $CF_4$/Ar/$N_2$, and the like as an etching gas, and the via hole 207 is made to go right through to the surface of the lower interconnect 201, as shown in FIG. 13A. Here, the etching device is the above-described RIE etching device, and the pressure of the etching gas is set at 10 Pa to 40 Pa of a usual etching pressure.

Figure 13B:
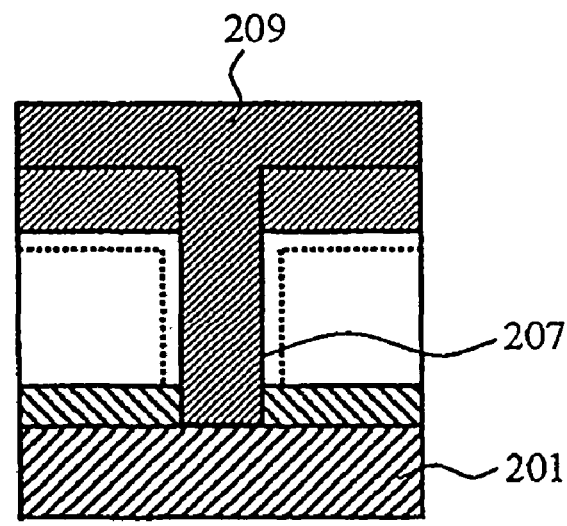
FIG. 13B is a sectional element view showing a process following the process shown in FIG. 13A.

Then, a interconnect material film 209 is formed by depositing of the barrier metal such as Ta and TaN by the sputtering method, by forming copper seeds, and by depositing by copper plating in such a way that the interconnect material film 209 is connected to the lower interconnect 201 and is filled in the via hole 207 as shown in FIG. 13B. Subsequently, copper annealing of the interconnect material film 209 is performed at 150 degrees centigrade to 350 degrees centigrade as shown in FIG. 13C.

Figure 14A:
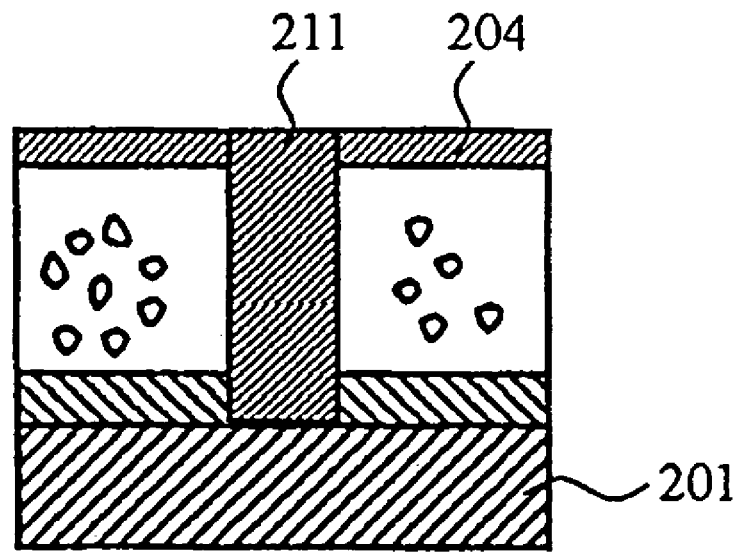
FIG. 14A is a sectional element view showing a process following the process shown in FIG. 13C.
Figure 14B:
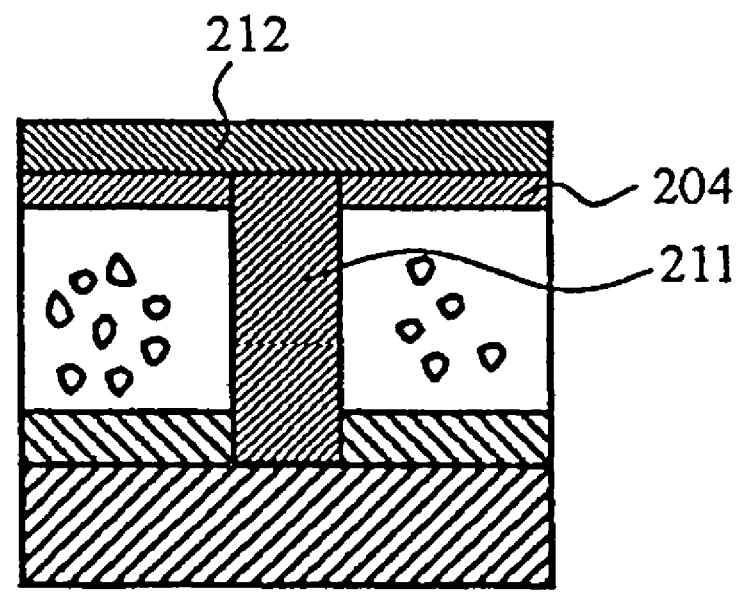
FIG. 14B is a sectional element view showing a process following the process shown in FIG. 14A.

Moreover, using the CMP method, unnecessary portions of the interconnect material film 209 on the cap layer 204 are polished and removed, assuming that the cap layer 204 is used as a polishing stopper, to form a via plug 211 which is connected to the lower interconnect 201, as shown in FIG. 14A. Subsequently, as shown in FIG. 14B, a second etching stopper layer 212 is formed with a SiC film and the like so that the second etching stopper layer 212 covers the surface portion of the via plug 211 and the cap layer 204.

However, it has been found that a damage layer 208 is formed in the vicinity of the side wall of the low-k film 203 of the via hole 208 as shown in FIG. 13A, especially, in dry etching of the SiC film of the first etching stopper layer 202 when a porous low dielectric constant film is used as a low-k film, according to the method which has been explained referring to FIG. 12 to FIG. 14. In the case of the above-described p-MSQ film, this damage layer 208 is in a reformed state in which a methyl group is dissociated and removed. Then, it has been cleared that there is generated a problem that moisture, copper of the interconnect material film, or the barrier metal such as TaN intrudes into the inside of the low-k film 203 through this damage layer 208 to cause reduction in the insulating performance of the interlayer insulating film, rise in the relative dielectric constant, and an increase in a leakage current between the interconnects. The reason is considered that the above-described side wall is reformed by radical elements of fluorine which are generated by the plasma excitation at the dry etching. Moreover, it has been understood that the damage layer 208 is also formed on an interfacial area between the low-k film 203 and the cap layer 204 in dry etching of the first etching stopper layer 202. The damage layer formed this area causes pealing off of the low-k film 203 or the interconnect material film 209 during the polishing process of the interconnect material film 209 by the CMP method.

Figure 13C:
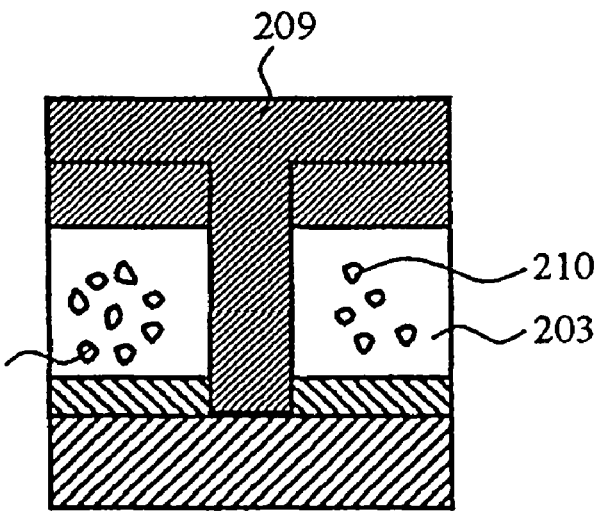
FIG. 13C is a sectional element view showing a process following the process shown in FIG. 13B.

Moreover, it has been found that voids 210 are generated in the low-k film 203 without control after the process of copper annealing as shown in FIG. 13C. When the voids 210 are generated, the mechanical strength of the low-k film 203 is reduced, and, even in this case, the above-described pealing off of the films during the polishing process of the interconnect material film 209 by the CMP method. The voids 210 seem to be generated in the following way. That is, the above-described fluorine radicals which have generated the damage layer 208 in FIG. 13A are taken into the low-k film 203, and, during the copper annealing process in FIG. 13C, the radicals react with the moisture taken into the low-k film 203 in the copper plating process in FIG. 13B to generate hydrofluoric acid (HF) in the low-k layer 203. Subsequently, the HF locally etches the low-k film 203 to generate the voids 210 in the low-k film 203.

The present inventors have tried to improve the method for manufacturing the semiconductor device with the above examination taken into consideration. The method will be explained in the following.

First Embodiment

FIG. 1A to FIG. 4B are sectional element views showing processes according to which a damascene interconnect structure with embedded copper according to the first embodiment of the present invention is manufactured, A silicon oxide film is deposited on a silicon substrate by a chemical vapor deposition (CVD) method to form a base insulating film (not shown). Then, a lower interconnect 1 composed mainly of a copper film of a conductive layer is formed by a well-known method by which damascene interconnect is formed. Subsequently, an SiC film with a film thickness of about 25 nanometers and with a relative dielectric constant of about 3.5 is deposited as a first etching stopper layer 2a of a first insulating film. Then, a first low dielectric constant film 2b with a relative dielectric constant of about 2.5 and with a film thickness of 200 nanometers to 300 nanometers is formed as a second insulating film. The first low dielectric constant film 2b is formed by, for example, a porous p-MSQ film, on which voids are formed on an MSQ film containing a methyl group as shown in FIG. 5, according to a spin coating method. Here, the porosity of the first low dielectric constant film 2b may be about 30% to about 40%. The porosity is a rate of the difference, which is obtained by subtracting "the density of a porous MSQ film" from "the density of a bulk MSQ film which is closely-grained, and not porous", to "the density of the bulk MSQ film which is closely-grained, and not porous".

Figure 1A:
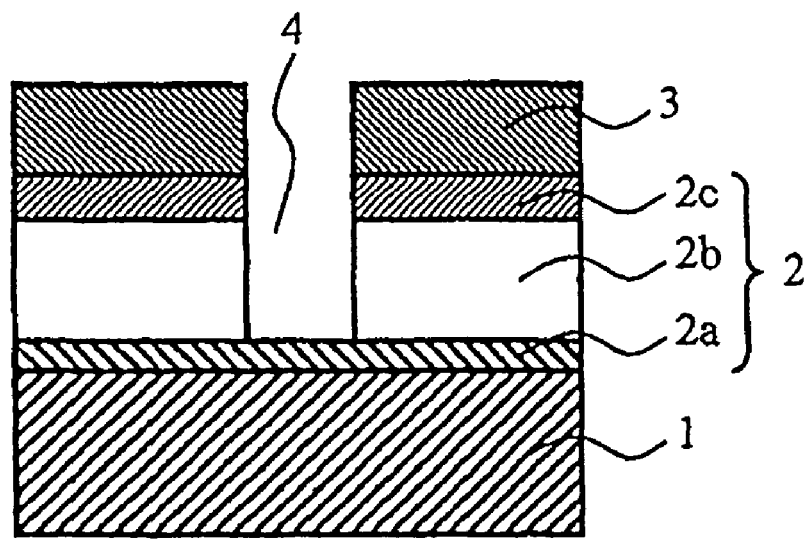
FIG. 1A is a sectional element view showing a process according to which a damascene interconnect structure according to a first embodiment of the present invention is manufactured.

Then, a first cap layer 2c is formed on the surface of the above-described first low dielectric constant film 2b as a third insulating film. The first cap layer 2c is composed of a carbon content silicon oxide film (SiOC film) deposited by a CVD method, and the SiOC film has a film thickness of about 100 nanometers and a relative dielectric constant of about a range of 2.5 to about 3. Thus, an interlayer insulating film 2 including the first etching stopper layer 2a, the first low dielectric constant film 2b, and the first cap layer 2c is formed. Here, it is preferable to expose the surface of the first low dielectric constant film 2b to plasma in order to improve the adhesiveness between the first low dielectric constant film 2b and the first cap layer 2c. Thus, using a resist mask 3 with an aperture pattern of a via hole as a etching mask, dry etching of the above-described first cap layer 2c and that of the first low dielectric constant film 2b are executed in this order by RIE to form a via hole 4 with a diameter of about 80 nanometers. At this time, the first etching stopper layer 2a is not removed (FIG. 1A).

Figure 6:
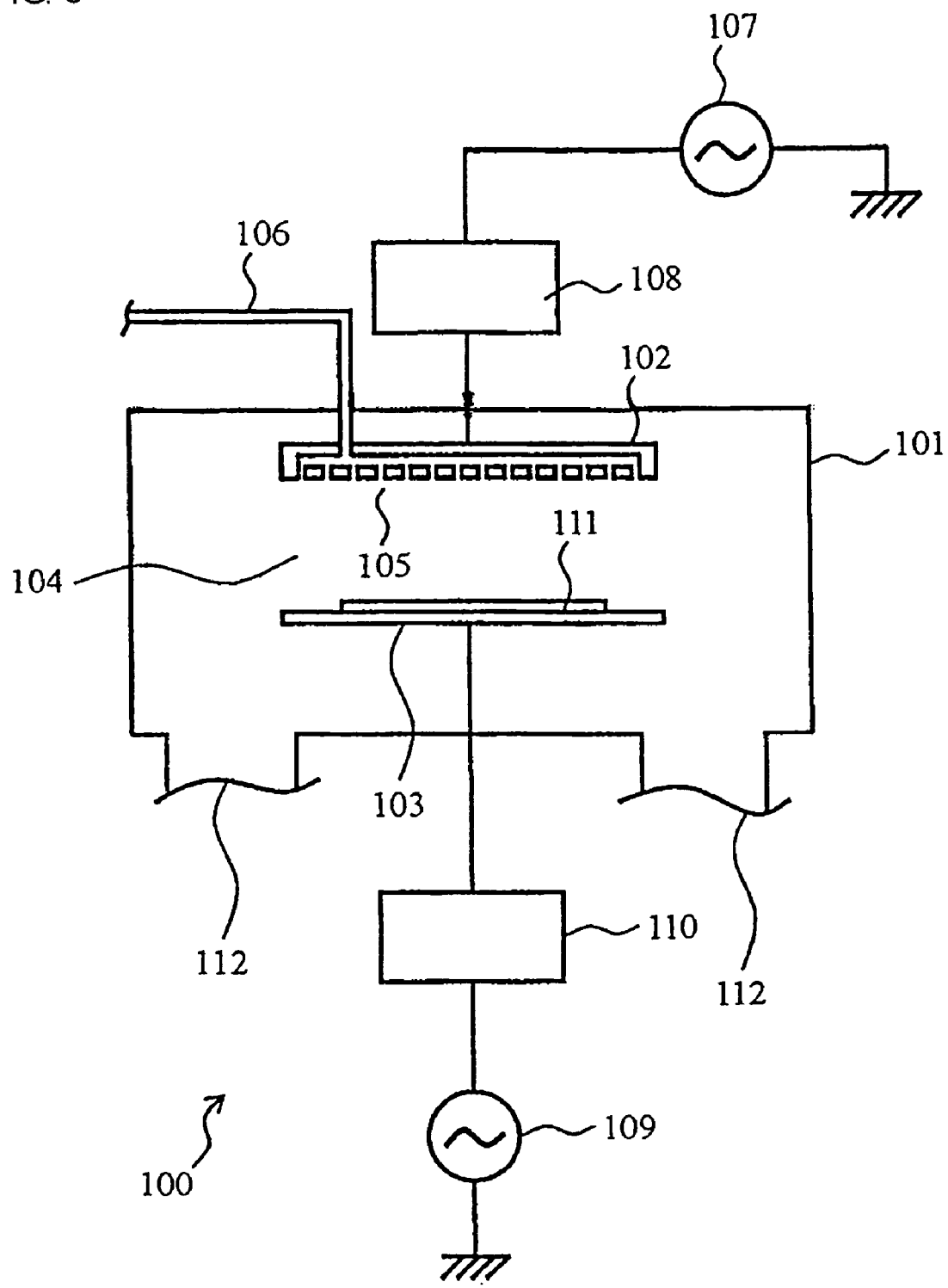
FIG. 6 is an exemplary and sectional view of a dry etching device used in embodiments according to the present invention.

In the dry etching of the first cap layer 2c and the first low dielectric constant film 2b fluorocarbon gas such as a mixed gas of $C_4F_8$/Ar, a mixed gas of $C_5F_8$/Ar, the mixed gas with additional $O_2$ gas, or the mixed gas with additional $N_2$ gas is used as an etching gas, and an RIE device described later in FIG. 6 is used as an etching device. Here, the gas pressure in the processing chamber of the above-described etching gas is set in about usual 20 Pa described later. The first etching stopper layer 2a is hardly etched by the above-described etching gas including a fluorocarbon gas with a large bonding amount of carbon atoms. In this dry etching, a number of organic polymers are generated as a reaction product, and the reaction product adheres to the side wall of the via hole 4 as a protection film to protect the side wall from etching by radicals of fluorine. Thus, the damage layer 208 formed in the neighborhood of the side wall as described referring to FIG. 13A, is not generated at this time. As for the etching gas, one of the gasses selected from a group including the fluorocarbon gas with a general form represented by a chemical formula of $C_xH_yF_z$ (x, y, and z are integers, x is equal to or larger than 4, y is equal to or larger than 0, and z is equal to or larger than 1) may be used.

Figure 1B:
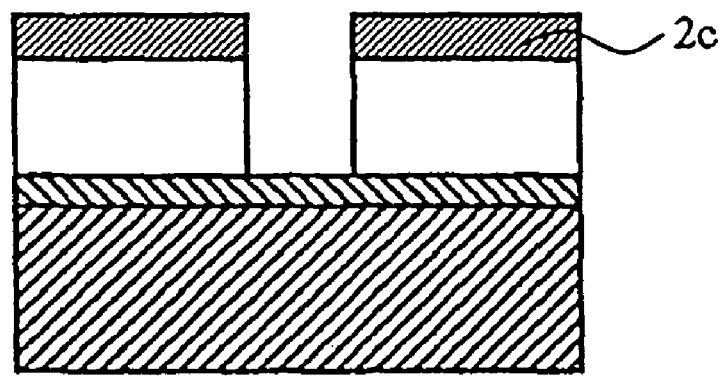
FIG. 1B is a sectional element view showing a process following the process shown in FIG. 1A.

Then, the above-described resist mask is removed by plasma of an $H_2$ gas, a He gas, and the like. By this resist removal, the resist mask of an organic material on the first cap layer 2c, and organic polymer of the same organic material on the above-described side wall are removed (FIG. 1B).

Subsequently, using the above-described first cap layer 2c as a so-called hard mask, the first etching stopper layer 2a is selectively removed by etching. This method of this dry etching will be explained, using a concrete example.

FIG. 6 is an exemplary and sectional view of an RIE device 100 which is used for forming a via hole or a interconnect trench on the interlayer insulating film 2.

An upper electrode 102 and a lower electrode 103, which are facing each other in a parallel-plate-electrode structure, are installed in a chamber 101, and a plasma generation space 104, an etching processing room, exists therebetween. And, the upper electrode 102 has a shower head structure in which a gas inlet port 105 is provided, and communicates with a gas supply line 106 to cause discharge of the etching gas to the plasma generation space 104. Moreover, a first high-frequency power source 107 is connected to the upper electrode 102 through a first matching device 108, and a high-frequency power of about 50 MHz is applied to the upper electrode 102. Similarly, the lower electrode 103 is connected to a second high-frequency power source 109 through a second matching device 110, and a high-frequency power with a frequency of about 1 MHz is applied to the lower electrode 103. And, a semiconductor wafer 111 which is a substrate to be processed is adsorbed by a not-shown electrostatic chuck mechanism, fixed, and mounted on the upper surface of the lower electrode 103. Here, plasma-excitation of, mainly, the etching gas is executed by the first high-frequency power source 107, and the second high-frequency power source 109 controls ion incident energy from the above-described plasma to the semiconductor wafer 111.

In the above-described RIE device, the desired etching gas, which will be explained later, is discharged from the gas inlet port 105 to the plasma generation space 104 through the gas supply line 106 after the semiconductor wafer 111 is mounted on the lower electrode 103, and the first high-frequency power source 107 and the second high-frequency power source 109 respectively supply high-frequency power of about 1 kilowatt between the upper electrode 102 and the lower electrode 103. Then, plasma of the above-described etching gas is generated in the plasma generation space 104, and, at this time, the pressure of the plasma generation space 104 is controlled at an adequate value by an exhaust mechanism (not-shown) such as a vacuum pump communicating with a gas exhaust port 112.

Figure 1C:
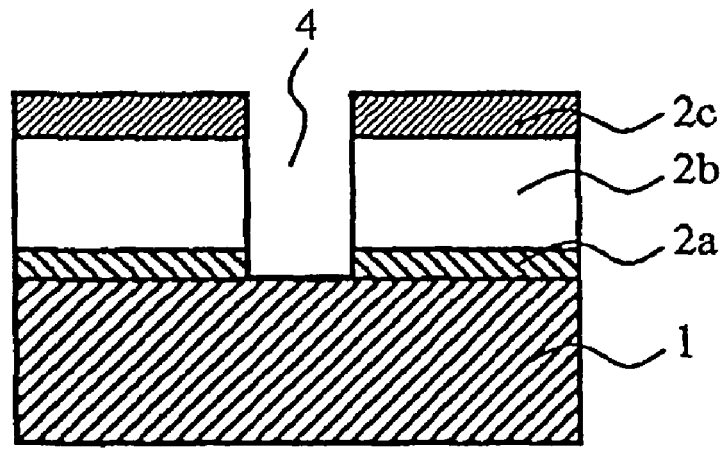
FIG. 1C is a sectional element view showing a process following the process shown in FIG. 1B.

When, using the first cap layer 2c as a hard mask, the first etching stopper layer 2a is selectively removed by etching in the above-described RIE device 100, a mixed gas of $CF_4/Ar/N_2$, or a mixed gas of $CHF_3/Ar/N_2$ may be used as an etching gas. Then, plasma excitation of the above-described etching gas is executed, and the gas pressure in the plasma generation space 104 is controlled in a preferable range of 0.1 Pa to 6.0 Pa. Under such etching conditions, the first etching stopper layer 2a is selectively removed by etching, and the via hole 4 is made to go right through to the surface of the lower interconnect 1 (FIG. 1C).

The etching can be executed for example, under the following conditions.

Example 1

Etching device: Tokyo Electron made Telius-SCCM 300 mm;
Pressure: 40 mTorr (5.33 Pa);
Power: 750 Ws/120 Wb (Where Ws: Source Power, and Wb: Bias Power);
Flow Rate: $CF_4$: 100 sccm+Ar: 800 sccm+$N_2$: 500 sccm; and
Temperature: 20 degrees centigrade Example 2

Etching device: Tokyo Electron made Telius-SCCM 300 mm;
Pressure: 25 mTorr (3.33 Pa);
Power: 1250 Ws/150 Wb (Where Ws: Source Power, and Wb: Bias Power);
Flow Rate: $CF_4$: 100 sccm+Ar: 200 sccm+$N_2$: 250 sccm; and
Temperature: 20 degrees centigrade Here, it is preferable that the bias power Wb is set at 100 Watts or more, and less than 200 Watts. When the bias power is smaller than 100 watts, an SiC etch rate is reduced, and the uniformity is deteriorated. Moreover, the sputtering effect for a cap film is decreased. When the bias power becomes 200 watts or more, the sputtering effect is increased to cause a state that the obtained side wall deposit becomes too much, and a facet of the cap film becomes remarkable.

While the pressure of the etching gas, for which the mixed gas of the $CHF_3/Ar/N_2$, or the mixed gas of $CF_4/Ar/N_2$ is used, has been assumed to be a usual value of 10 Pa to 40 Pa in the example explained in FIG. 13A, the gas pressure is set in a low-pressure area, in which the pressure is an order of magnitude lower, as described above in this invention. The ion content of the fluorine is increased by such a gas pressure set in a low-pressure area to cause reduction in the radical amount of the fluorine. Then, especially, nitrogen in the etching gas promotes decomposition of the SiC film forming the first etching stopper layer 2a. At the same time, the SiC film is sputtered with ions of nitrogen, fluorine, or the like, those go straight. Subsequently, a reaction product which is obtained by chemical bonding between the sputtered scatters or carbons and nitrogen adheres again to the side wall of the via hole 4 to form a thin side-wall protective layer on the exposed surface of the first low dielectric constant film 2b. Here, the details of a forming process of the side wall protective layer, and the structure of the reaction product have not been clear, but it has been found that sputtering of the surface of the first cap layer 2c and that of the first etching stopper layer 2a by bombardment of the above-described ions (ion bombardment) are largely effected, and the film thickness is thin, and the relative dielectric constant is small (about three). And, the side wall protective layer generated on the side wall prevents the above-described fluorine radicals from intruding into the inside of the first low dielectric constant film 2b. Such an effect will be described later, referring to FIGS. 7A, 7B, 8A, and 8B later.

Figure 2A:
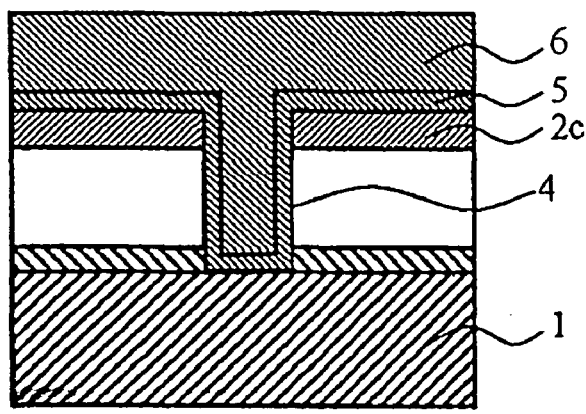
FIG. 2A is a sectional element view showing a process following the process shown in FIG. 1C.

Referring to FIG. 2A, a Ta film and a TaN film with a film thickness of 1 nanometer to 5 nanometers are formed as a conductive barrier film by a sputtering method (a physical vapor deposition (PVD) method), or the ALD method. Thus, a first barrier metal film 5 connected to the lower interconnect 1 is deposited in such a way that the film 5 covers the first cap layer 2c, and is embedded into the via hole 4. Then, forming a copper seed layer by sputtering, and using a copper plating method, a first copper film 6 with a film thickness of 200 nanometers to 500 nanometers is formed as a interconnect material so that the first copper film 6 is filled in the via hole 4. Then, heat-treating at about 150 degrees centigrade to about 350 degrees centigrade is performed under an atmosphere of nitrogen. The first copper film 6 is crystallized by this copper annealing to enhance bonding between the first barrier metal film 5 and the first copper film 6.

Figure 2B:
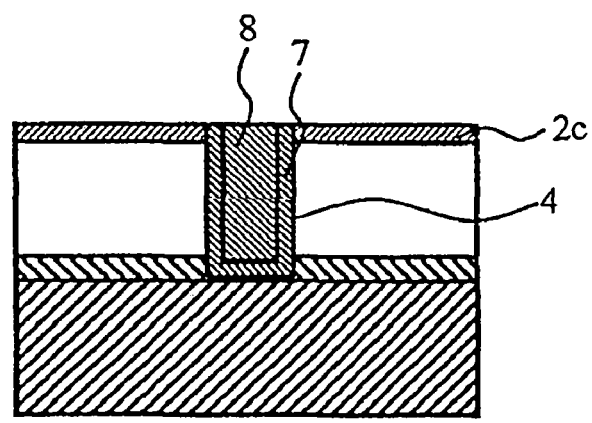
FIG. 2B is a sectional element view showing a process following the process shown in FIG. 2A.

Then, using the CMP method, a copper film and the first barrier metal film 5, which are unnecessary portions on the first cap layer 2c, are polished and removed in this order, where the first cap layer 2c is used as a polishing stopper, and a via plug 8 which is a conductive layer is filled and formed through a first barrier layer 7 in the via hole 4 (FIG. 2B).

Figure 2C:
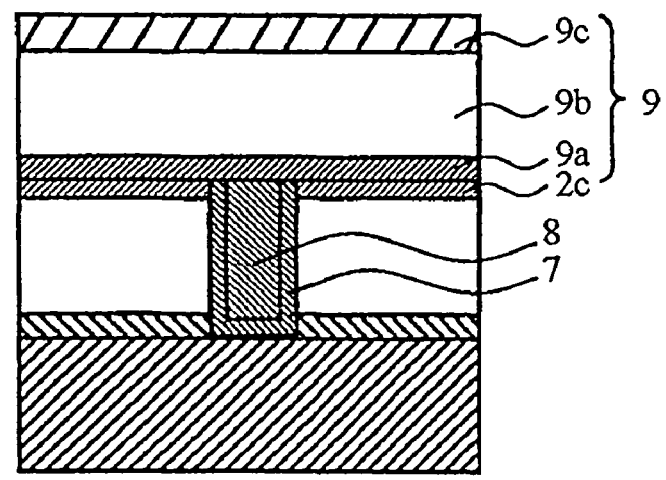
FIG. 2C is a sectional element view showing a process following the process shown in FIG. 2B.

Thereafter, a second etching stopper layer 9a (a first insulating film) composed of a SiC film with a film thickness of about 25 nanometers, and a second low dielectric constant film 9b (a second insulating film) composed of a p-MSQ film, with a relative dielectric constant of about 2.0, and with a film thickness of 200 nanometers to 300 nanometers are formed so that the first cap layer 2c, the upper portion of the first barrier layer 7, and the via plug 8 are covered. Then, a second cap layer 9c (a third insulating film) composed of, for example, an SiOC film with a film thickness of 100 nanometers is formed on the surface of the above-described second low dielectric constant film 9b to form a second interlayer insulating film 9 including the laminate structure of the layers 9a, 9b, and 9c (FIG. 2C).

Figure 3A:
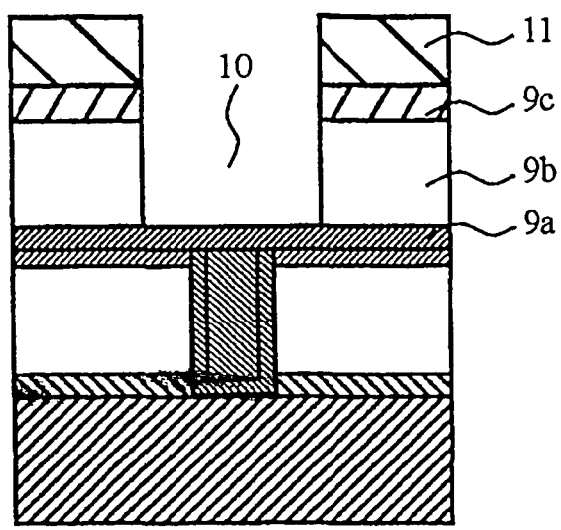
FIG. 3A is a sectional element view showing a process following the process shown in FIG. 2C.

Then, using a resist mask 11 with an aperture pattern of a interconnect trench 10 as an etching mask, the above-described second cap layer 9c and the second low dielectric constant film 9b are selectively removed in this order by dry etching with the RIE device to form the interconnect trench 10 with a width of about 100 nanometers. Here, the second etching stopper layer 9a is not etched (FIG. 3A). When the second cap layer 9c and the second low dielectric constant film 9b are selectively removed by dry etching, a mixed gas of $C_4F_8/Ar/O_2$, a mixed gas of $C_4F_8/Ar/N_2$, a mixed gas of $C_5F_8/Ar/O_2$ and the like, and a mixed gas of $C_5F_8/Ar/N_2$ and the like are used as the etching gas in the RIE device 100 in a similar manner to that of FIG. 1A. Even in this case, the second etching stopper layer 9a is hardly etched by the above-described etching gas. Subsequently, a lot of organic polymers are generated as a reaction product, the reaction product adheres to the side wall of the interconnect trench 10 as a protection film, and the side wall is protected from etching by the radicals of fluorine.

Figure 3B:
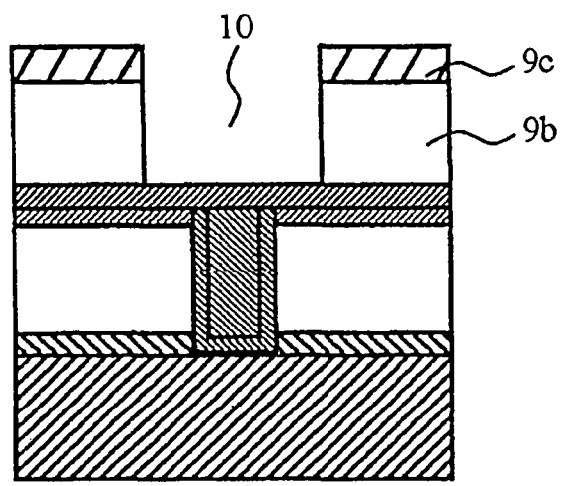
FIG. 3B is a sectional element view showing a process following the process shown in FIG. 3A.

Then, the above-described resist mask 11 is removed by plasma in a similar manner to that of explanation for FIG. 1B, and the structure is washed to remove residues to form the interconnect trench 10 in the second cap layer 9c and the second low dielectric constant film 9b (FIG. 3B).

Figure 3C:
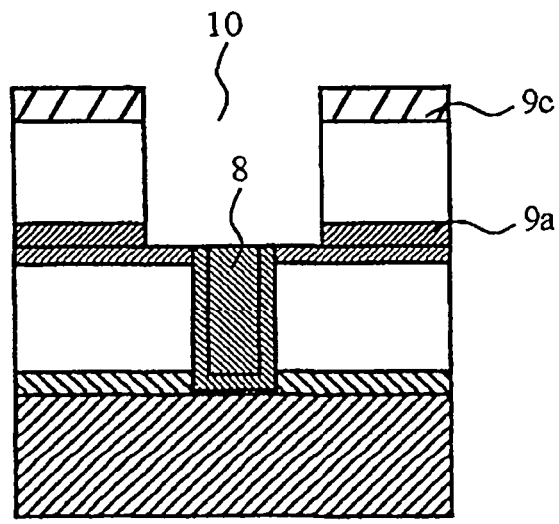
FIG. 3C is a sectional element view showing a process following the process shown in FIG. 3B.

Then, using the second cap layer 9c as a hard mask, the second etching stopper layer 9a is selectively removed by etching in the above-described RIE device 100. In this dry etching, plasma excitation is executed, using the mixed gas of $CF_4/Ar/N_2$ or the mixed gas of $CHF_3/Ar/N_2$ as an etching gas, under control of the gas pressure in the plasma generation space 104 of a processing chamber in a preferable range of 0.1 Pa to 6.0 Pa. Under such etching conditions, the second etching stopper layer 9a is selectively removed by etching, and the interconnect trench 10 is made to go right through to the via plug 8 (FIG. 3C). In this case, similar effects to those of explanation in FIG. 1C can be obtained. These effects will be explained later, referring to FIGS. 7A, 7B, 8A, and 8B later.

Subsequently, a second barrier metal film 12 is formed by depositing a Ta film with a film thickness of 5 nanometers to 10 nanometers and a TaN film with a film thickness of 5 nanometers to 10 nanometers according to the PVD method in this order in such a way that the side wall and the bottom surface of the interconnect trench 10, and the surface of the second cap layer 9c are covered. Then, a copper film with a film thickness 500 nanometers to 1 micrometer is formed, using the copper plating method and the like, and is deposited so that a second copper film 13 is laminated on the second barrier metal film 12 and is filled in the interconnect trench 10 (FIG. 4A). Here, the second barrier metal film 12 is connected to the first barrier layer 7 and the via plug 8. Then, using the CMP method, the second copper film 13 and the second barrier metal film 12, which are unnecessary portions on the second cap layer 9c, are polished and removed, where the second cap layer 9c is used as a polishing stopper. Thus, an upper interconnect 15 composed of copper interconnect is formed in the interconnect trench 10 provided in the second interlayer insulating film 9 with the average relative dielectric constant of about 2.0 to about 2.5 through the second barrier layer 14. Here, the upper layer interconnect 15 is electrically connected to the lower interconnect 1 through the via plug 8 formed in the first interlayer insulating film 2 with the average relative dielectric constant of about 2.5 to about 3.0. Thus, the two-layer interconnect of the damascene interconnect structure is formed (FIG. 4B).

Figure 7A:
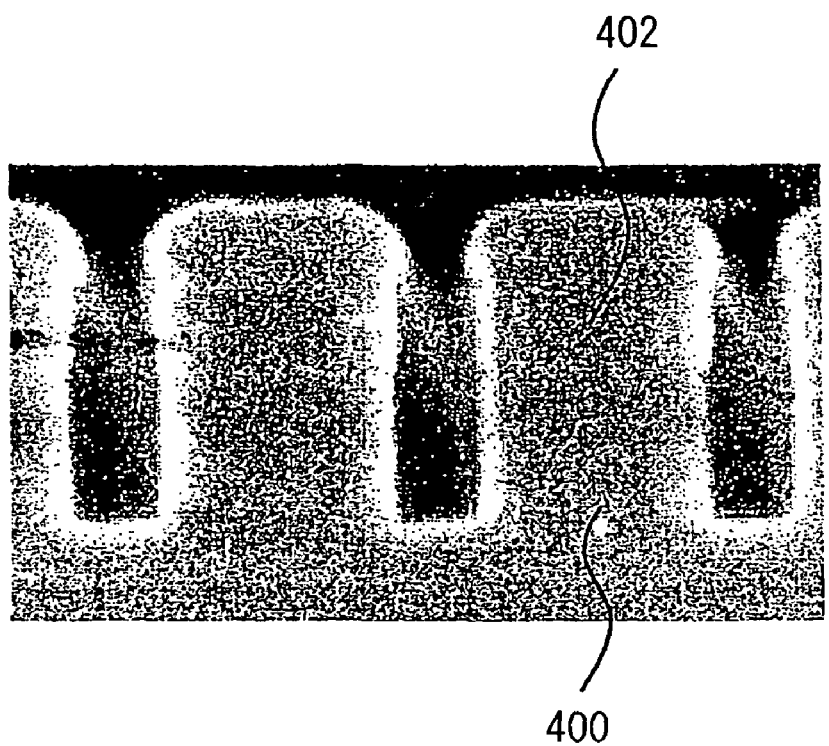
FIGS. 7A and 7B are sectional views explaining an effect by the first embodiment according to the present invention.
Figure 7B:
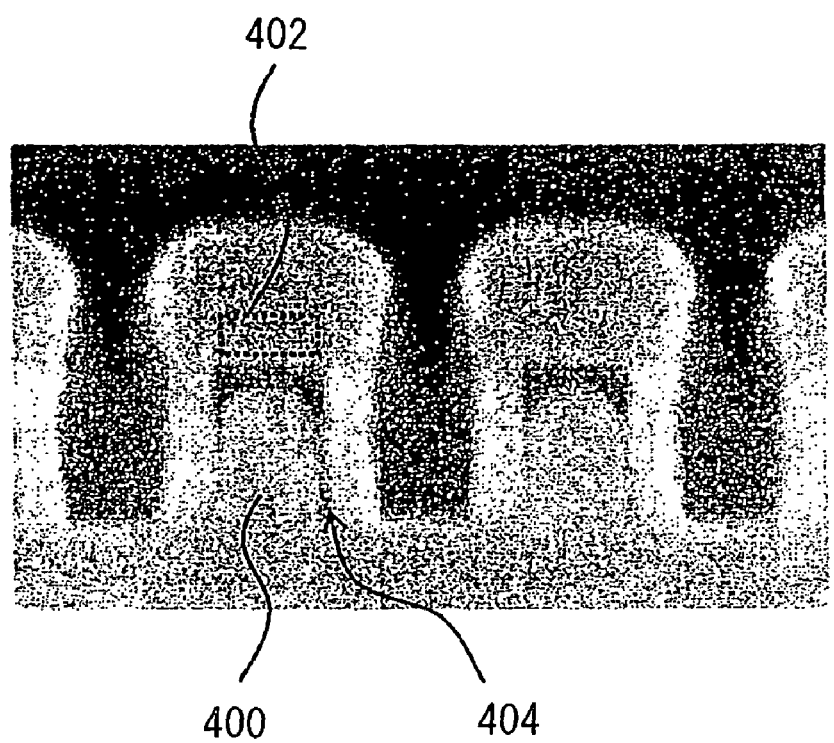
Figure 8A:
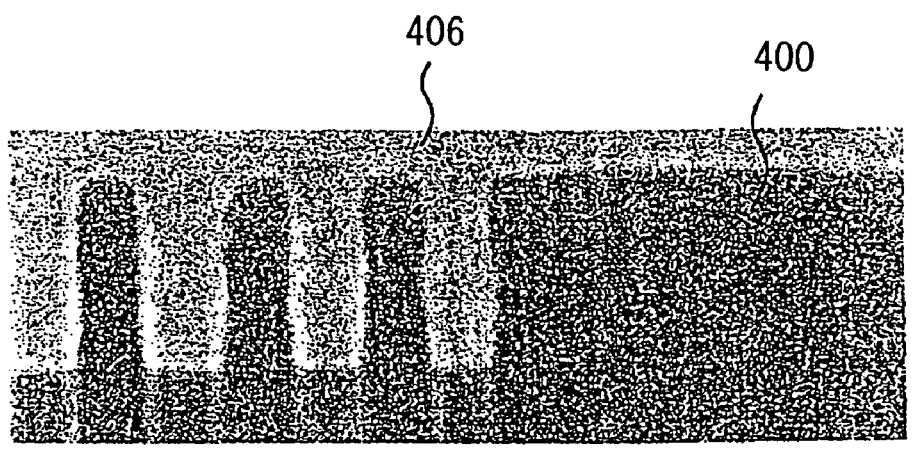
FIGS. 8A and 8B are sectional views explaining another effect by the first embodiment according to the present invention.
Figure 8B:
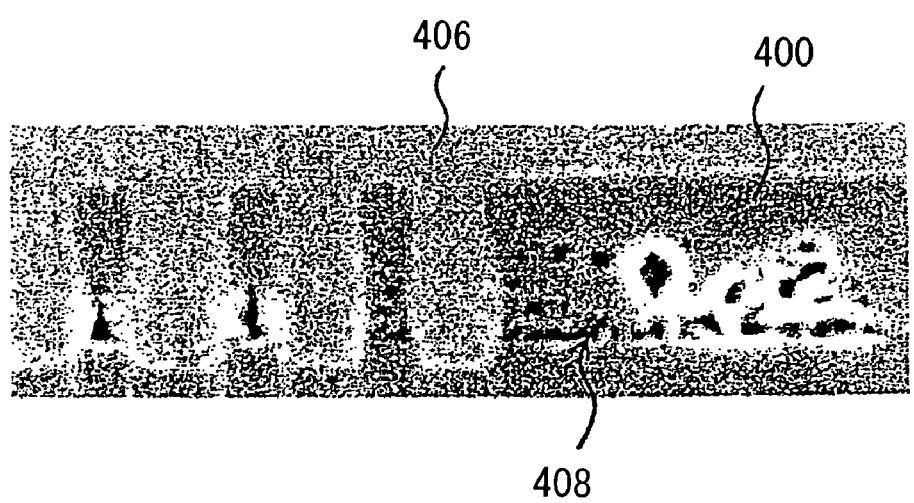

Effects generated in the above-described embodiment will be explained, based on FIGS. 7A, 7B, 8A and 8B. Here, FIG. 7A is a sectional view of a SEM photograph after dry etching of the SiC film in the first etching stopper layer 2a or the second etching stopper layer 9a, using the first cap layer 2c explained in FIG. 1C, or the second cap layer 9c explained FIG. 3C as a hard mask. FIG. 7B is a sectional view of a SEM photograph showing a product manufactured according to processes explained in FIG. 13A. In the above-described views, the surface is coated, and relief processing by immersion into an HF solution is done in order to clearly show the views. And, FIG. 8A is a sectional view of a SEM photograph after copper annealing, as explained in FIG. 2A, or FIG. 4A, at 350 degrees centigrade. FIG. 8B is a sectional view of a SEM photograph after the processes explained in FIG. 13C.

As clearly seen from FIG. 7A, in a dry etching process of the SiC film of an insulating barrier layer, there are not generated damage layers at all on the surface of a porous film with a low dielectric constant, which is exposed on the side wall of the via hole or the trench. Moreover, there are not generated damage layers at all on an interfacial area between the cap layer 402 and the low dielectric constant film 400.

On the other hand, in the example shown in FIG. 7B there is generated a damage layer on the surface of the porous film with a low dielectric constant, which is exposed on the side wall of the via hole or the trench, and, moreover, there is also generated a damage layer 404 on the interfacial area between the cap layer 402 and the low dielectric constant film 400.

Moreover, as clearly seen from FIG. 8A, there are not generated damage in the low dielectric constant film 400 at all, even when dry etching of the etching stopper layer comprising the SiC film is executed, the barrier metal film and the copper film 406 are filled in the via hole, or the trench, which goes right through to the lower interconnect or the via plug, and copper annealing at 350 degrees centigrade is executed. On the other hand, in the example shown in FIG. 8B, there are generated a lot of the above-described voids 408 in the low dielectric constant film 400.

In addition, by observing the semiconductor device manufactured by a same method as that shown in FIG. 7A by the X-ray photoelectron Spectroscopy, a protection film of CF (fluorocarbon) was seen on the side wall of the via hole or the interconnect trench formed in the porous low dielectric insulating film.

As described above, the gas pressure in the plasma generation space 104 of a mixed gas of $CHF_3/Ar/N_2$, and the mixed gas of $CF_4/Ar/N_2$ is set at 0.1 Pa to 6.0 Pa in the first embodiment of the present invention. When this gas pressure is set at 10 Pa to 40 Pa, radical elements, among active species generated in plasma excitation of the above-described etching gas, are increased as compared to ions, and the low dielectric constant film exposed on the side wall of the via hole or the trench is much damaged by isotropic thermal agitation of the increased radical elements of nitrogen or fluorine to generate the above-described damage layer. At the same time, the above-described fluorine radicals intrude deeply into the inside from the above-described damage layer through holes in the low dielectric constant film, and react with moisture intruded during a washing process or a copper plating process, the both of which are executed after dry etching of the etching stopper layer and before forming the barrier metal film. The fluorine radicals become HF to perform local etching of the low dielectric constant film of a siloxane skeleton. Then, there are generated a lot of the above-described voids.

On the other hand, when the pressure of the above-described etching gas is less than 10 Pa, especially, when the pressure of the above-described etching gas becomes 6.0 Pa or less, and the etching conditions are appropriately set as described in the first embodiment of the present invention, the ion contents of nitrogen and fluorine are greatly increased, and those radical amounts are reduced by plasma excitation of the above-described etching gas. At the same time, especially, nitrogen ions in the etching gas promote decomposition of an SiC film forming the first etching stopper layer 2a, and sputtering of the above-described SiC film is executed, using ions, which mainly go straight, of nitrogen, fluorine, argon or the like. Then, a reaction product obtained by chemical bonding between the sputtered carbon and nitrogen adheres again to the side walls of the via hole 4 and interconnect trench 10 to form a thin side-wall protective layer on the exposed surface of the first low dielectric constant film 2b and on the exposed surface of the second low dielectric constant film 9b. Generation of the side-wall protective layer is involved in sputtering of the first etching stopper layer 2a, or the second etching stopper layer 9a, and the surface of the first cap layer 2c or the surface of the second cap layer 9c by the above-described ion bombardment. The side-wall protective layer generated on the side wall prevents the above-described fluorine radicals from intruding into the low dielectric constant film. Thereby, generation of the damage layer and the voids is controlled.

The above-described sputtering is increased as the pressure of the above-described etching gas is decreased. However, when the above-described gas pressure is lower than 0.1 Pa, sputtering of the surface of the lower interconnect 1 exposed by removing the above-described etching stopper layer, or the surface of the via plug 8 and that of the first barrier layer 7 is executed by the above-described ions. And, by the above sputtering, copper or the barrier metal adheres again to the side wall of the via hole 4 or the interconnect trench 10, and intrudes into the porous low dielectric constant film to cause reduction in the insulating performance of the interlayer insulating film, or an increase in a leakage current between the interconnect layers. For this reason, the pressure of the above-described etching gas is preferably set within a range of 0.1 Pa to 6.0 Pa.

The fluorine compound gas used for the above-described etching gas may include at least one of the gasses selected from a group including $CF_4$, hydrofluorocarbon gas such as $CHF_3$, $CH_2F_2$, or $CH_3F$, or $NF_3$. Among these, it is preferable to use one of the gasses selected from a group including fluorocarbon such as $CF_4$, or hydrofluorocarbon gas such as $CHF_3$, $CH_2F_2$, or $CH_3F$. With this, a protection film with an appropriate thickness can be formed at the side wall of the via hole or the interconnect trench to prevent the intrusion of the fluorine radicals or the like into the low dielectric insulating layer. Moreover, a gas such as $NH_3$, and $N_2H_4$, other than a nitrogen gas, can be also used as a nitrogen content gas in a similar manner.

Moreover, an inert gas other than argon (Ar) such as krypton (Kr) or neon (Ne) can be also used as an additive gas in a similar manner as the etching gas in dry etching of the above-described interlayer insulating film or the above-described etching stopper layer of the insulating barrier layer.

The first etching stopper layer 2a and the second etching stopper layer 9a, which are the first insulating film may be formed as the insulating barrier layer with a silicon carbide and nitride (SiCN) film instead of the SiC film. In this case, much the same effects can be obtained by similar dry etching. Moreover, instead of the SiC film, a film containing one atom or a plurality of atoms of hydrogen (H), oxygen (O), and nitrogen (N) in silicon carbide can be similarly applied. Moreover, an ultra-thin silicon nitride (SiN) film can be also applied to the above-described etching stopper layer. Here, as the approximate relative dielectric constant of the SiN film is about seven and high, it is preferable to make the film thickness as thin as possible. Moreover, a plurality of the above-described insulating barrier layer films may be deposited as a laminated film.

In the above-described embodiment, the porosity of the first low dielectric constant film 2b or the second low dielectric constant film 9b of a porous structure forming the interlayer insulating film is preferably 30% to 50%. When the porosity exceeds 50%, the mechanical strength of the interlayer insulating film is reduced, and the barrier metal film, the copper film or the interlayer insulating film are easily peel off from each other in the above-described CMP method. Moreover, when the porosity becomes smaller than 30%, it is difficult to reduce the relative dielectric constant to 2.5 or less.

In the first embodiment, the first etching stopper layer 2a is selectively removed by etching, while the side wall protective layer is being formed on the porous first-low dielectric constant film 2b, which is exposed on the side wall of the via hole 4 provided in the first interlayer insulating film 2, as described above. Or, the second etching stopper layer 9a is selectively removed by etching, while the side wall protective layer is being formed on the porous second-low dielectric constant film 9b, which is exposed on the side wall of the trench 8 provided in the second interlayer insulating film 9. Thereby, no bowing shape is generated by side etching of the side wall of the via hole and the trench in the damascene structure. Moreover, oxidation of the surface of the lower interconnect 1 is controlled, because a nitrogen content gas, instead of an oxygen content gas, has been added to the etching gas in dry etching of the first etching stopper layer 2a and the second etching stopper layer 9a. Thus, even in a fine damascene interconnect structure, the filling characteristics of the interconnect material is improved, and less probability that poor electric connection between the interconnect layers is caused is obtained to improve the manufacturing yield of the semiconductor device.

Then, the side walls of the via hole and the trench both having the damascene structure, formed on the first low dielectric constant film 2b and the second low dielectric constant film 9b, which are a porous low dielectric constant film, are coated with a thin low dielectric constant side-wall-protective layer as described above. Thereby, the damage layer is not formed at all in the vicinity of the above-described side wall to completely prevent moisture, copper of the interconnect material film, the barrier metal, for example, Ta or TaN, or the like from intruding into the inside of the interlayer insulating film. Here, the rise of the total dielectric constant of the interlayer insulating film, which has been caused by formation of the pore seal in the conventional technology, is eliminated. Accordingly, the interlayer insulating film of the damascene interconnect structure has high reliability, and problems such as an increase in the leakage current between interconnect layers and faulty electrical continuity in the via hole portion are totally eliminated.

Moreover, as the above-described side-wall protective layer prevent the fluorine radicals from intruding into the porous low dielectric constant film, voids are not generated in the low dielectric constant film forming the interlayer insulating film after copper annealing processing as described above, peeling off of the interlayer insulating film, or the interconnect material film in the CMP method can be eliminated.

Then, multi-layered damascene interconnect can be easily achieved in the semiconductor device to form a fine damascene interconnect structure with high reliability in the semiconductor device at practical levels. Thus, the semiconductor device with high reliability and high-speed operations is realized.

Second Embodiment

Hereinafter, second embodiment according to the present invention will be explained, referring to FIGS. 9A to 11B. The characteristic of this embodiment is that the invention is applied to an interconnect composed of copper (alloy) and formed by dual damascene. Here, FIGS. 9A to 11B are sectional element views showing processes according to which a dual damascene interconnect structure in which an upper layer interconnect is formed by integrating a via plug and the damascene interconnect is manufactured.

Figure 9A:
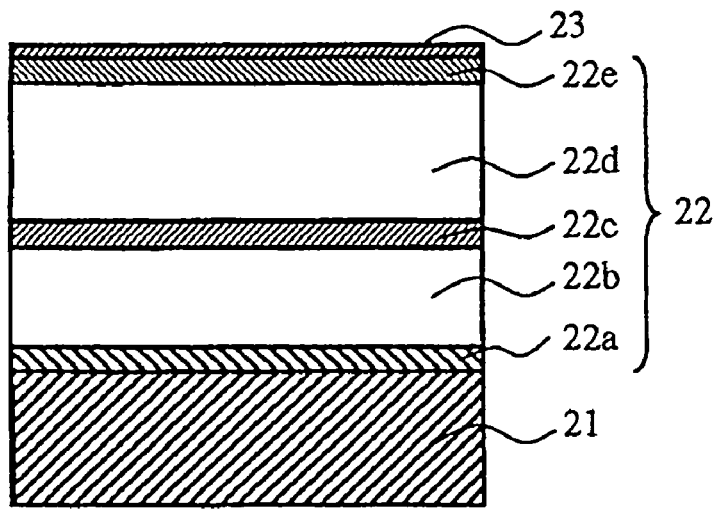
FIG. 9A is a sectional element view showing a process according to which a dual damascene interconnect structure according to the second embodiment of the present invention is manufactured.

A silicon oxide film is deposited on a silicon substrate by the CVD method to form a base insulating film (not shown) Then, a lower interconnect 21 is formed by deposition of a well-known aluminum copper alloy and processing thereof. Subsequently, an SiC film with a film thickness of about 25 nanometers, and with a relative dielectric constant of about 3.5 is deposited as an etching stopper layer 22a (first insulating film), and a first low dielectric constant film 22b (second insulating film) with a relative dielectric constant of 2.0 or less, and with a film thickness of 200 nanometers to about 300 nanometers is formed by deposition of a p-MSQ film according to the spin coating method. Here, the porosity of the first low dielectric constant film 22b is about 50%. Then, a mid-stopper layer 22c composed of a SiOC film, which has a film thickness of about 100 nanometers and a relative dielectric constant of about 2 to 3, is formed on the above-described first low dielectric constant film 22b. The mid-stopper layer 22c can be formed by the CVD method. Furthermore, a second low dielectric constant film 22d (second insulating film) is formed on the mid-stopper layer 22c. This second low dielectric constant film 22d is formed in a similar manner to that of the first low dielectric constant film 22b. However, the film thickness is configured to be thicker than that of the first low dielectric constant film 22b. Then, a cap layer 22e (third insulating film) is formed on the second low dielectric constant film 22d in a similar manner to that of the mid-stopper layer 22c. An interlayer insulating film 22 composed of these insulating films is formed by laminating these insulating films in a multi-layered manner. Here, the cap layer 22e is used for a first hard-mask layer as will be described later. Then, a second hard-mask layer 23 (fourth insulating film) composed of a SiC film with a film thickness of, for example, about 25 nanometers is formed on this cap layer 22e (FIG. 9A).

Figure 9B:
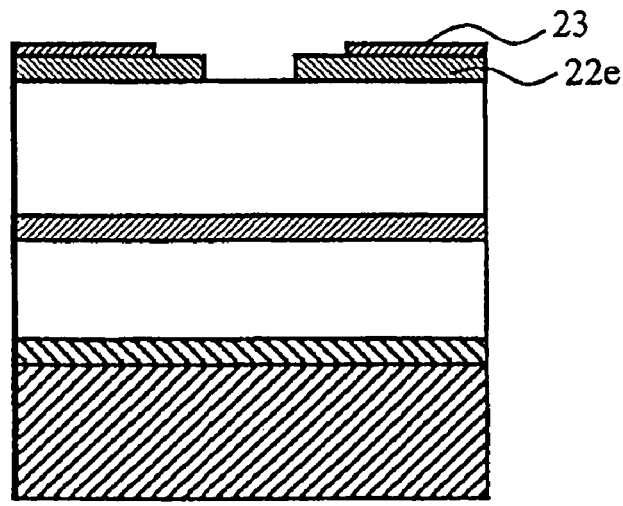
FIG. 9B is a sectional element view showing a process following the process shown in FIG. 9A.

Then, using resist masks, the above-described second hard-mask layer 23 and the cap layer 22e are processed for etching to transfer patterns corresponding to the resist marks respectively by a well-known photolithography technology and the dry etching technology. The first hard-mask layer 22e having an aperture with a diameter of, for example, 80 nanometers and the second hard-mask layer 23 having an aperture with a width dimension of, for example, 100 nanometers are formed. Subsequently, the above-described resist mask is removed by the method which has been explained in the first embodiment (FIG. 9B).

Figure 9C:
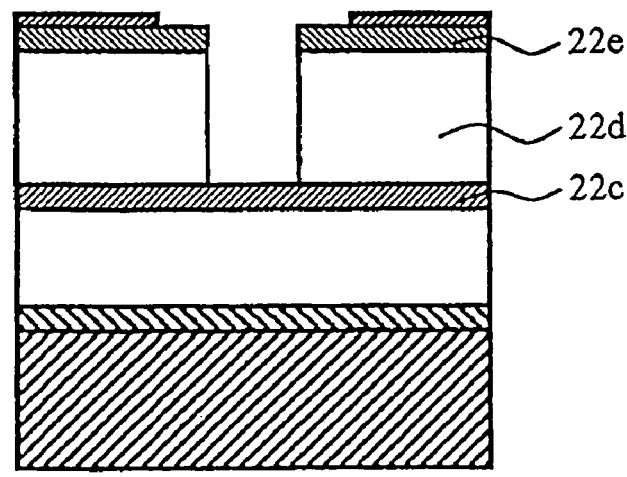
FIG. 9C is a sectional element view showing a process following the process shown in FIG. 9B.

Then, the second low dielectric constant film 22d is selectively removed by dry etching with the RIE method using the first hard-mask layer 22e as an etching mask to transfer a pattern of a via hole going right through to the surface of the mid-stopper layer 22c. Here, an etching gas to be used is, for example, a fluorocarbon-system gas of $C_5F_8$/Ar (FIG. 9C).

Figure 10A:
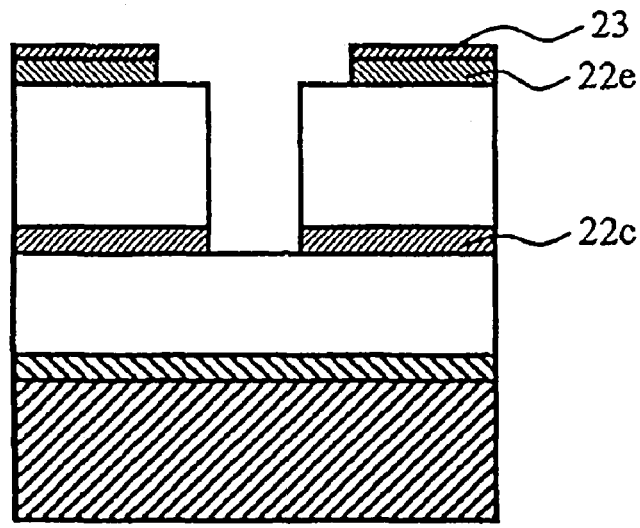
FIG. 10A is a sectional element view showing a process following the process shown in FIG. 9C.

Subsequently, the first hard-mask layer 22e is selectively removed by dry etching with the RIE method using the second hard-mask layer 23 as an etching mask to transfer a trench pattern of the second hard-mask layer 23 on the first hard-mask layer 22e. At the same time, the mid-stopper layer 22c is etched for via-pattern transfer. Here, an etching gas to be used is, for example, a fluorocarbon-system gas of $C_4F_8$/Ar/$O_2$ or $C_4F_8$/Ar/$N_2$ (FIG. 10A).

Figure 10B:
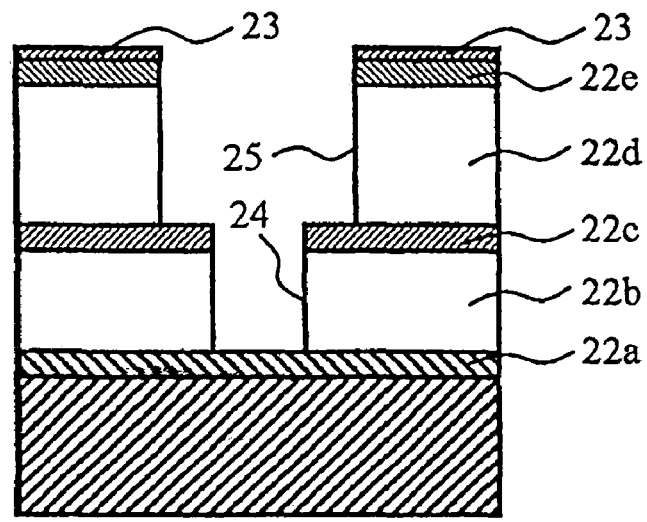
FIG. 10B is a sectional element view showing a process following the process shown in FIG. 10A.

Thereafter, the second low dielectric constant film 22d is selectively removed by etching in the RIE device 100 shown in FIG. 6, using the first hard-mask layer 23 as an etching mask to transfer a trench pattern on the second low dielectric constant film 22d. At the same time, using the mid-stopper layer 22c as an etching mask, the first low dielectric constant film 22b is selectively removed by etching to transfer the via pattern on the first low dielectric constant film 22b. Here, an etching gas to be used is a fluorocarbon-system gas of $C_4F_8$/Ar or $C_5F_8$/Ar. At least one kind of etching gas, which is selected from a group including the fluorocarbon gas represented by a chemical formula of $C_xH_yF_z$ (x, y, and z are integers, x is equal to or larger than 4, y is equal to or larger than 0, and z is equal to or larger than 1), may be used as such the fluorocarbon gas. Then, plasma excitation of the above-described etching gas is executed, and the gas pressure in the plasma generation space 104 is controlled at about 20 Pa. Thus, a via hole 24 of the dual damascene structure is formed in the first low dielectric constant film 22b and the mid-stopper layer 22c, and, similarly, a trench 25 of the dual damascene structure is formed in the second low dielectric constant film 22d and the cap layer 22e. However, the etching stopper layer 22a is not etched at this time. Then, the dual damascene structure is washed to remove residues on the side walls of the via holes 24 and the trench 25 (FIG. 10B).

Figure 10C:
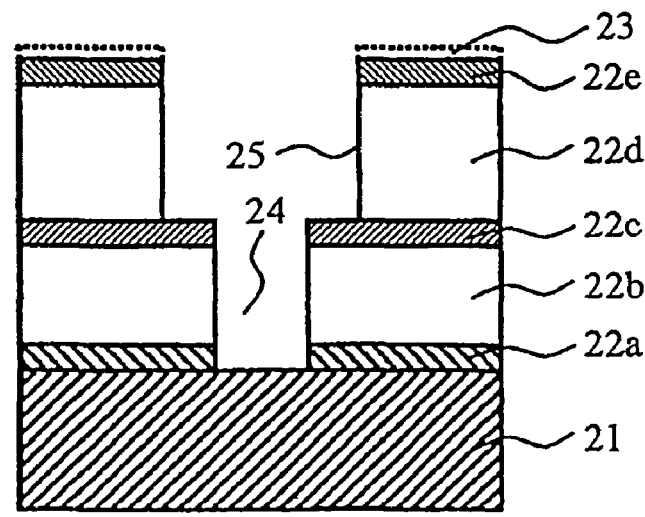
FIG. 10C is a sectional element view showing a process following the process shown in FIG. 10B.

Subsequently, an exposed portion of the etching stopper layer 22a is etched and removed in the RIE device 100, using the cap layer 22e and the mid-stopper layer 22c as hard masks. Here, plasma excitation of the above-described etching gas is performed, using a mixed gas of $CF_4$/Ar/$N_2$ or a mixed gas of $CHF_3$/Ar/$N_2$ as an etching gas, under control of the gas pressure in the plasma generation space 104 in a preferable range of 0.1 Pa to 6.0 Pa. Under such etching conditions, the etching stopper layer 22a is selectively removed by etching, and the via hole 24 which will have the dual damascene structure, is made to go right through to the surface of the lower interconnect 21 (FIG. 10C).

In this case, the gas pressure in the plasma generation space 104 of a mixed gas of $CHF_3$/Ar/$N_2$, and a mixed gas of $CF_4$/Ar/$N_2$ is set at 0.1 Pa to 6.0 Pa in this embodiment of the present invention. The ion content of the fluorine is increased by such a gas pressure to cause reduction in the radical amount of the fluorine. Then, especially, nitrogen in the etching gas promotes decomposition of SiC forming the etching stopper layer 22a and the second hard-mask layer 23, ions, which mainly go straight, of nitrogen, fluorine, or the like form a thin side-wall protective layer on the surface of the exposed first low dielectric constant film 22b in the side wall of the via hole 24, and the surface of the exposed second low dielectric constant film 22d in the side wall of the trench 25. Moreover, the side-wall protective layers generated on these side walls prevent the above-described fluorine radicals from intruding into the inside of the first low dielectric constant film 22b, and into the inside of the second low dielectric constant film 22d.

Figure 11A:
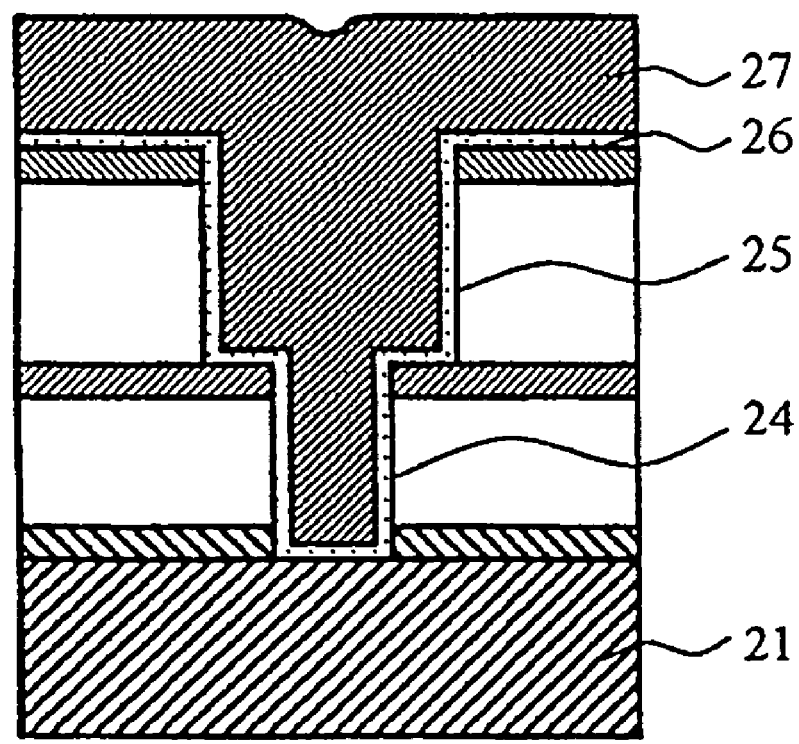
FIG. 11A is a sectional element view showing a process following the process shown in FIG. 10C.
Figure 11B:
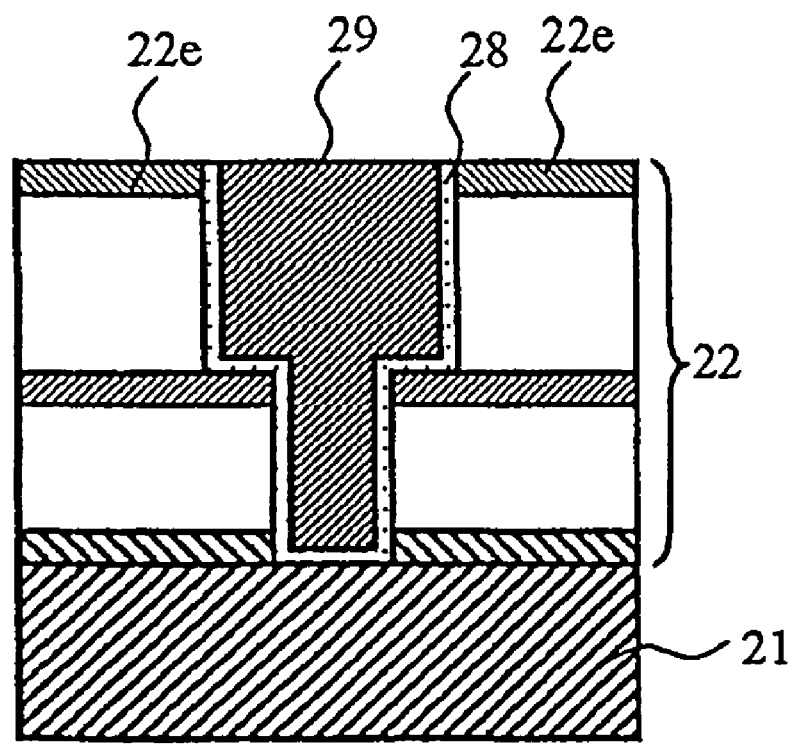
FIG. 11B is a sectional element view showing a process following the process shown in FIG. 11A.

Subsequently, a barrier metal film 26 with a laminated structure of a Ta film/a TaN film with a film thickness of 5 nanometers to 10 nanometers is deposited by the PVD method or the ALD method. Moreover, a copper film 27 with a film thickness of 500 nanometers to 1 micrometer is laminated and deposited, using the copper plating method and the like in such a way that the film 27 is filled in the via hole 24 and the trench 25, which have the dual damascene structure (FIG. 11A). Here, the barrier metal film 26 is connected to the lower interconnect 21. Then, using the CMP method, the copper film and the laminated barrier metal film, which are unnecessary portions on the cap layer 22e, are polished and removed, where the cap layer 22e is used as a polishing stopper. Thus, a barrier layer 28, and an upper layer interconnect 29 having the dual damascene interconnect structure are formed in the via plug 24 and the trench 25, which have the dual damascene structure, and, which are connected to the lower interconnect 21, and are provided in the interlayer insulating film 22 with an average relative dielectric constant of about 2.0 or less to complete two-layered interconnect with the dual damascene interconnect structure (FIG. 11B).

In the above-described embodiment, much the same effects can be obtained by similar dry etching even when the second hard-mask layer 23 of the fourth insulating film is formed with a SiCN film used as an insulating barrier layer, other than the SiC film. Moreover, even a film containing one atom or a plurality of atoms of hydrogen (H), oxygen (O), and nitrogen (N) in the silicon carbide can be similarly applied. Moreover, a laminated film in which a plurality of the above-described insulating barrier layer films have been deposited may be applied.

In the above-described second embodiment, much the same effects as those explained in the first embodiment can be obtained. And, a side-wall protective layer can be easily formed on the side wall of the via hole 24, and on the side wall of the trench 25 in this embodiment, because sputtering of the surface of the fourth insulating film, other than sputtering of the first insulating film 22a by ions in plasma, is further executed in dry etching of the etching stopper layer 22a of the first insulating film. Moreover, the damascene interconnect structure is more simply manufactured in this case than in the first embodiment. Accordingly, a part of the insulation layers (etching stopper layer or cap layer), except the porous low dielectric constant film inserted into the interlayer insulating film, can be eliminated to further reduce the total dielectric constant of the interlayer insulating film. And, the operations of the semiconductor device have been executed more and more quickly.

Though preferable embodiments according to the present invention have been explained above, the above-described embodiments do not limit this invention. In a specific aspect, various modifications and alterations may occur to those skilled in the art without departing from the technical idea and technical scope of the invention as defined in the appended claims.

For example, a low dielectric constant film of other porous insulating films with a siloxane skeleton, or a porous insulating film with an organic polymer as a main skeleton can be used as a porous insulating film of the second insulating film according to this invention in a similar manner to the case of the p-MSQ film. A silica film, which is an insulating film of a silsesquioxane group, including at least one bond of a bond of Si and $CH_3$, that of Si and H, and that of Si and F may be applied as an insulating film with the above-described siloxane skeleton. Moreover, SILK (a registered trademark) composed of an organic polymer may be applied as an insulating film with an organic polymer as a main skeleton. And, an insulating material which has been well known as an insulating film of a silsesquioxane group is hydrogen silsesquioxane (HSQ), methylated hydrogen silsesquioxane (MHSQ), and the like, in addition to the above-described MSQ. Similarly, a porous SiOCH film, and a porous SiOC film, which are deposited by the CVD method, may be used as a low dielectric constant film with a porous structure.

Moreover, a silicon oxidation film, or a silicon nitride film, which are different from the above-described second insulating film, may be used as the above-described third insulating film.

Moreover, in the above-described copper-filled damascene interconnect a W film, a WN film, a WSiN film, a Ti film, a TiN film, and a TiSiN film may be used as a conductive barrier film which will be used as a barrier layer.

Furthermore, damascene interconnect may be filled with another conductive material film, though copper or a copper alloy is filled in the above-described via hole, or the above-described trench. Here, a high melting point metal film such as a W film or a gold (Au) film may be used as a conductive material film.

It is apparent that the present invention is not limited to the above embodiment, that may be modified and changed without departing from the scope and spirit of the invention.

What is claimed is:

1. A method for manufacturing a semiconductor device including a semiconductor substrate, an element formed on said semiconductor substrate, and an insulating film formed on said element, comprising:
    (a) forming a first conductive layer composed of copper as a main component on said insulating film;
    (b) forming a first insulating film composed of silicon carbide as a main component on the upper portion of said first conductive layer;
    (c) forming a second insulating film with a porous structure on said first insulating film;
    (d) forming a third insulating film different from said second insulating film on said second insulating film;
    (e) forming a via hole or an interconnect trench in said second insulating film and said third insulating film by dry etching of said third insulating film and said second insulating film in this order;
    (f) removing a part of said first insulating film by dry etching with said third insulating film used as an etching mask, and a mixed gas consisting of fluorine compound gas and at least one of inert gases and a nitrogen content gas used as an etching gas under the condition where the pressure of said mixed gas in an etching processing chamber is set within a range of 0.1 Pa to 6.0 Pa, such that the surface of said first conductive layer is exposed at the bottom of said via hole or said interconnect trench, said fluorine compound gas including at least one of the gases selected from the group consisting of $CF_4$, $CHF_3$, $CH_2F_2$, $CH_3F$, and $NF_3$; and
    (g) forming a second conductive material film layer so as to fill said via hole or said interconnect trench.

2. The method for manufacturing a semiconductor device according to claim 1, wherein, in said (f) process, said fluorine compound gas including at least one of the gases selected from the group consisting of $CF_4$, $CHF_3$, $CH_2F_2$, and $CH_3F$.

3. The method for manufacturing a semiconductor device according to claim 1, wherein, in said (d) process, said third insulating film is formed with a material containing carbon.

4. The method for manufacturing a semiconductor device according to claim 1, wherein, in said (f) process, said dry etching is performed under plasma-excitation of said mixed gas while a side wall protective layer is formed on the side wall of said via hole or said interconnect trench by adhering scatters or reaction products, generated by sputtering of said first insulating film and said third insulating film with ions generated by said plasma excitation of said mixed gas, onto the side wall of said via hole or said interconnect trench.

5. The method for manufacturing a semiconductor device according to claim 4, wherein, in said (d) process, a fourth insulating film composed of silicon carbide as a main component is formed on said third insulating film; in said (e) process, said via hole or said interconnect trench is formed in said second insulating film, said third insulating film, and said fourth insulating film by dry etching of said fourth insulating film, said third insulating film and said second insulating film in this order; and in said (f) process, said fourth insulating film is sputtered with said first insulating film and said third insulating film by said ions generated by said plasma excitation of said mixed gas.

6. A method for manufacturing a semiconductor device including a semiconductor substrate, an element formed on said semiconductor substrate, and an insulating film formed on said element, comprising:
(a) forming a first conductive layer composed of copper as a main component on said insulating film;
(b) forming a first insulating film composed of silicon carbide as a main component on the upper portion of said first conductive layer;
(c) forming a second insulating film with a porous structure on said first insulating film;
(d) forming a third insulating film different from said second insulating film on said second insulating film;
(e) forming a via hole or an interconnect trench in said second insulating film and said third insulating film by dry etching of said third insulating film and said second insulating film in this order;
(f) removing a part of said first insulating film by dry etching under plasma-excitation of a mixed gas consisting of fluorine compound gas and at least one of inert gases and a nitrogen content gas with said third insulating film used as an etching mask, while forming a side wall protective layer on the side wall of said via hole or said interconnect trench by adhering scatters or reaction products, generated by sputtering of said first insulating film with ions generated by said plasma excitation of said mixed gas, onto the side wall of said via hole or said interconnect trench, such that the surface of said first conductive layer is exposed at the bottom of said via hole or said interconnect trench, said fluorine compound gas including at least one of the gases selected from the group consisting of $CF_4$, $CHF_3$, $CH_2F_2$, $CH_3F$, and $NF_3$; and
(g) forming a second conductive material film layer so as to fill said via hole or said interconnect trench.

7. The method for manufacturing a semiconductor device according to claim 6, wherein, in said (f) process, said fluorine compound gas including at least one of the gases selected from the group consisting of $CF_4$, $CHF_3$, $CH_2F_2$, and $CH_3F$.

8. The method for manufacturing a semiconductor device according to claim 6, wherein, in said (d) process, a fourth insulating film composed of silicon carbide as a main component is formed on said third insulating film; in said (e) process, said via hole or said interconnect trench is formed in said second insulating film, said third insulating film, and said fourth insulating film by dry etching of said fourth insulating film, said third insulating film and said second insulating film in this order; and in said (f) process, said fourth insulating film is sputtered with said first insulating film by said ions generated by plasma excitation of said mixed gas.

9. The method for manufacturing a semiconductor device according to claim 6, wherein, in said (d) process, said third insulating film is formed with a material containing carbon.

10. The method for manufacturing a semiconductor device according to claim 1, wherein, in said (f) process, said mixed gas includes said nitrogen content gas and said nitrogen content gas includes at least one of the gases selected from the group consisting of $N_2$, $NH_3$, and $N_2H_4$.

11. The method for manufacturing a semiconductor device according to claim 6, wherein, in said (f) process, said mixed gas includes said nitrogen content gas and said nitrogen content gas includes at least one of the gases selected from the group consisting of $N_2$, $NH_3$, and $N_2H_4$.

12. The method for manufacturing a semiconductor device according to claim 1, wherein, in said (e) process, said dry etching of said second insulating film is executed, using at least one of the gases etching gas selected from the group consisting of a fluorocarbon gas represented by a chemical formula of $C_xH_yF_z$ (where x, y, and z are integers, x is equal to or larger than 4, y is equal to or larger than 0, and z is equal to or larger than 1).

13. The method for manufacturing a semiconductor device according to claim 6, wherein, in said (e) process, said dry etching of said second insulating film is executed, using at least one of the gases etching gas selected from the group consisting of a fluorocarbon gas represented by a chemical formula of $C_xH_yF_z$ (where x, y, and z are integers, x is equal to or larger than 4, y is equal to or larger than 0, and z is equal to or larger than 1).

14. The method for manufacturing a semiconductor device according to claim 12, wherein, in said (e) process, said fluorocarbon gas is $C_4F_6$, $C_4F_8$, or $C_5F_8$.

15. The method for manufacturing a semiconductor device according to claim 13, wherein, in said (e) process, said fluorocarbon gas is $C_4F_6$, $C_4F_8$, or $C_5F_8$.

16. The method for manufacturing a semiconductor device according to claim 1, wherein, in said (e) process, an etching gas of said dry etching includes an inert gas.

17. The method for manufacturing a semiconductor device according to claim 6, wherein, in said (e) process, an etching gas of said dry etching includes an inert gas.

18. The method for manufacturing a semiconductor device according to claim 1, wherein, in said (b) process, said first insulating film includes at least one of the films selected from the group consisting of an SiC film, an SiCN film, an SiOC film, and an SiCH film.

19. The method for manufacturing a semiconductor device according to claim 6, wherein, in said (b) process, said first insulating film includes at least one of the films selected from the group consisting of an SiC film, an SiCN film, an SiOC film, and an SiCH film.

20. The method for manufacturing a semiconductor device according to claim 5, wherein said fourth insulating film includes at least one of the films selected from the group consisting of an SiC film, an SiCN film, an SiOC film, and an SiCH film.

21. The method for manufacturing a semiconductor device according to claim 1, wherein in said (f) process, said inert gases including argon.

22. The method for manufacturing a semiconductor device according to claim 6, wherein in said (f) process, said inert gases are argon.

23. The method for manufacturing a semiconductor device according to claim 1, wherein a relative dielectric constant of said second insulating film is 2.5 or less.

24. The method for manufacturing a semiconductor device according to claim 6, wherein a relative dielectric constant of said second insulating film is 2.5 or less.

25. The method for manufacturing a semiconductor device according to claim 6, wherein, in said (g) process, said second conductive material film layer is formed on said side wall protective layer.

* * * * *